(12) United States Patent
Lee et al.

(10) Patent No.: US 11,128,399 B2
(45) Date of Patent: Sep. 21, 2021

(54) SYSTEMS, METHODS AND DEVICES FOR MEETING CELLULAR DATA TURNAROUND TIME

(71) Applicant: APPLE INC., Cupertino, CA (US)

(72) Inventors: Dae Won Lee, Portland, OR (US); Seunghee Han, San Jose, CA (US); Ajit Nimbalker, Fremont, CA (US); Shirish Nagaraj, Pleasanton, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 16/475,619

(22) PCT Filed: Dec. 26, 2017

(86) PCT No.: PCT/US2017/068431
§ 371 (c)(1),
(2) Date: Jul. 2, 2019

(87) PCT Pub. No.: WO2018/128873
PCT Pub. Date: Jul. 12, 2018

(65) Prior Publication Data
US 2019/0327024 A1    Oct. 24, 2019

Related U.S. Application Data

(60) Provisional application No. 62/444,102, filed on Jan. 9, 2017, provisional application No. 62/444,208, filed on Jan. 9, 2017.

(51) Int. Cl.
*H04J 11/00* (2006.01)
*H04L 1/00* (2006.01)
(Continued)

(52) U.S. Cl.
CPC .......... *H04L 1/0053* (2013.01); *H04L 1/0008* (2013.01); *H04L 1/0061* (2013.01);
(Continued)

(58) Field of Classification Search
CPC combination set(s) only.
See application file for complete search history.

(56) References Cited

U.S. PATENT DOCUMENTS 8,254,245 B2 * 8/2012 Kim ...................... H04L 5/0053
370/207
9,160,485 B2 * 10/2015 Kim ...................... H04L 1/0061
(Continued)

FOREIGN PATENT DOCUMENTS

EP          1971096 A2    9/2008
WO       2016107160 A1    7/2016

OTHER PUBLICATIONS

Nokia, "CRC attachment for eMBB data", R1-1612279, 3GPP TSG-RAN WG1 #87, Reno, Nevada, USA, Agenda Item 7.1.5.1, Nov. 14-18, 2016, 4 pages.
(Continued)

*Primary Examiner* — Phuongchau Ba Nguyen
(74) *Attorney, Agent, or Firm* — Stoel Rives LLP

(57) ABSTRACT

A receiver processes a data signal and provides an acknowledgement within a turnaround time through use of code block alignment, reduced complexity or increased processing time. In a first embodiment, a radio access network (RAN) node enables encoded information to be segmented into multiple code blocks and maps a group of code blocks to be aligned with orthogonal frequency division multiplexing (OFDM) symbol boundaries such that efficient receiver processing can implement processing pipelining. In a second embodiment, the transmitter can provide more time or reduce the complexity of the packet, such as by repetition of bits of code blocks of the encoded information or by reserving resource elements (REs) such that the receiver has effectively more time (or less complexity) to process the last or last few code blocks of the packet.

16 Claims, 20 Drawing Sheets

(51) Int. Cl.
*H04L 5/00* (2006.01)
*H04L 27/26* (2006.01)

(52) U.S. Cl.
CPC .......... *H04L 5/0007* (2013.01); *H04L 5/0046* (2013.01); *H04L 27/2604* (2013.01); *H04L 27/2607* (2013.01)

(56) References Cited

U.S. PATENT DOCUMENTS

| | | | |
|---|---|---|---|
| 2005/0030887 A1* | 2/2005 | Jacobsen | H04L 1/0009 370/208 |
| 2005/0111345 A1 | 5/2005 | Jacobsen et al. | |
| 2006/0256708 A1* | 11/2006 | Wang | H03M 13/27 370/206 |
| 2008/0225965 A1* | 9/2008 | Pi | H04L 1/0068 375/260 |
| 2013/0083867 A1* | 4/2013 | Frenne | H04L 1/0072 375/308 |
| 2017/0366299 A1* | 12/2017 | Li | H04L 5/00 |
| 2019/0181986 A1* | 6/2019 | Kitamura | H04L 1/1819 |
| 2019/0312678 A1* | 10/2019 | Yokomakura | H04L 69/324 |
| 2020/0021396 A1* | 1/2020 | Ma | H03M 13/155 |

OTHER PUBLICATIONS

PCT/US2017/068431, International Search Report and Written Opinion, dated Jun. 12, 2018, 20 pages.

\* cited by examiner

SYSTEMS, METHODS AND DEVICES FOR MEETING CELLULAR DATA TURNAROUND TIME

RELATED APPLICATION

This application claims the benefit under 35 U.S.C. § 119(e) of U.S. Provisional Application No. 62/444,102 filed Jan. 9, 2017 and of U.S. Provisional Application No. 62/444,208 filed Jan. 9, 2017, which is incorporated by reference herein in its entirety.

TECHNICAL FIELD

The present disclosure relates to cellular technology and more specifically to encoding data to help a user equipment (UE) meet turnaround time.

BACKGROUND

Wireless mobile communication technology uses various standards and protocols to transmit data between a base station and a wireless mobile device. Wireless communication system standards and protocols can include the 3rd Generation Partnership Project (3GPP) long term evolution (LTE); the Institute of Electrical and Electronics Engineers (IEEE) 802.16 standard, which is commonly known to industry groups as worldwide interoperability for microwave access (WiMAX); and the IEEE 802.11 standard for wireless local area networks (WLAN), which is commonly known to industry groups as Wi-Fi. In 3GPP radio access networks (RANs) in LTE systems, the base station can include a RAN node such as a Evolved Universal Terrestrial Radio Access Network (E-UTRAN) Node B (also commonly denoted as evolved Node B, enhanced Node B, eNodeB, or eNB) and/or Radio Network Controller (RNC) in an E-UTRAN, which communicate with a wireless communication device, known as user equipment (UE). In fifth generation (5G) wireless RANs, RAN nodes can include a 5G node, new radio (NR) node or g Node B (gNB).

RANs use a radio access technology (RAT) to communicate between the RAN node and UE. RANs can include global system for mobile communications (GSM), enhanced data rates for GSM evolution (EDGE) RAN (GERAN), Universal Terrestrial Radio Access Network (UTRAN), and/or E-UTRAN, which provide access to communication services through a core network. Each of the RANs operates according to a specific 3GPP RAT. For example, the GERAN implements GSM and/or EDGE RAT, the UTRAN implements universal mobile telecommunication system (UMTS) RAT or other 3GPP RAT, and the E-UTRAN implements LTE RAT.

A core network can be connected to the UE through the RAN node. The core network can include a serving gateway (SGW), a packet data network (PDN) gateway (PGW), an access network detection and selection function (ANDSF) server, an enhanced packet data gateway (ePDG) and/or a mobility management entity (MME).

DETAILED DESCRIPTION

Figure 1:
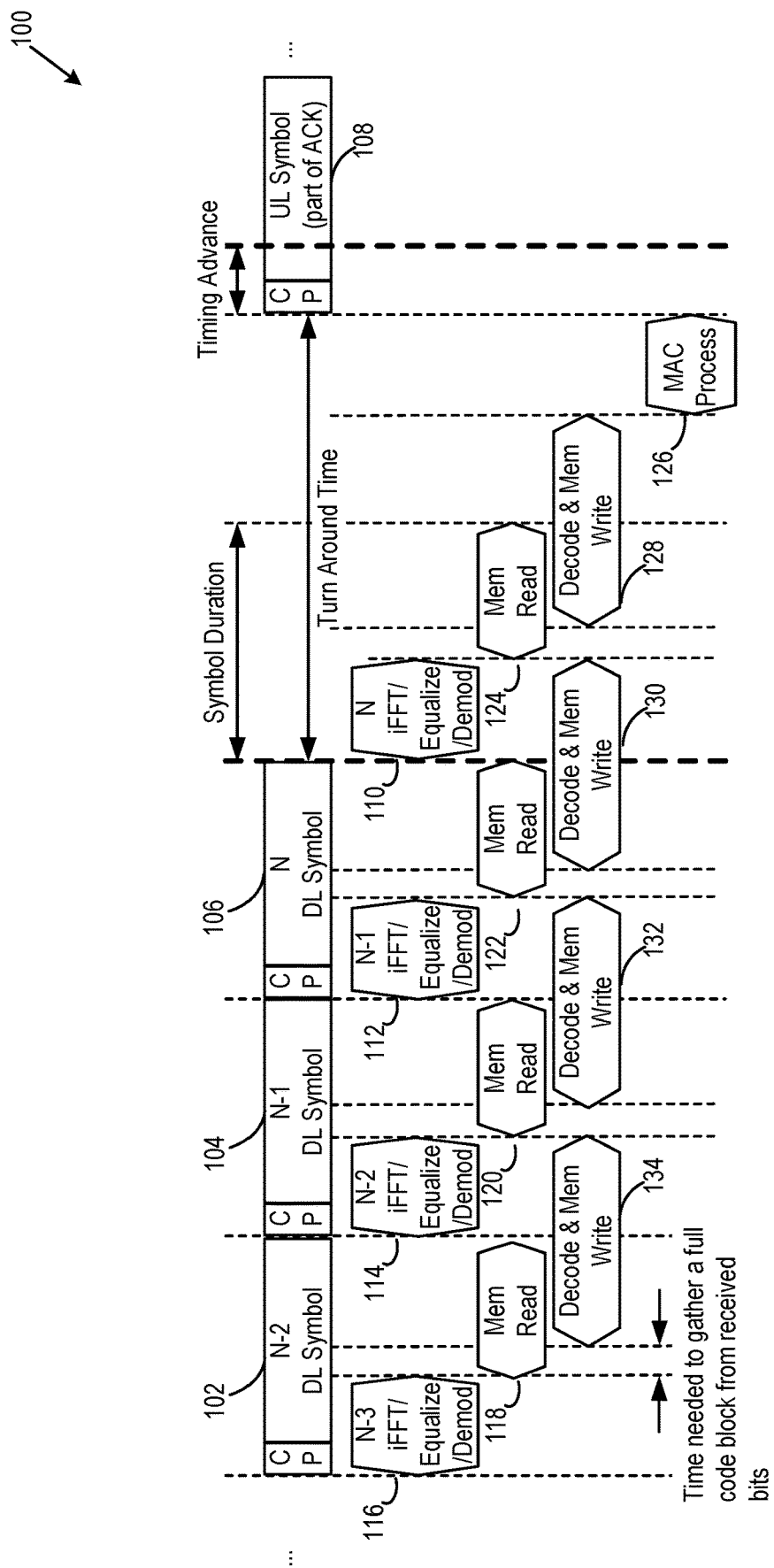
FIG. 1 is a diagram illustrating a pipelined processing of received data signal and transmission of an acknowledgement (ACK) consistent with embodiments disclosed herein.

A detailed description of systems and methods consistent with embodiments of the present disclosure is provided below. While several embodiments are described, it should be understood that the disclosure is not limited to any one embodiment, but instead encompasses numerous alternatives, modifications, and equivalents. In addition, while numerous specific details are set forth in the following description in order to provide a thorough understanding of the embodiments disclosed herein, some embodiments can be practiced without some or all of these details. Moreover, for the purpose of clarity, certain technical material that is known in the related art has not been described in detail in order to avoid unnecessarily obscuring the disclosure.

Techniques, apparatus and methods are disclosed that enable a receiver to process a data signal and provide an acknowledgement within a turnaround time. In a first embodiment, a radio access network (RAN) node enables encoded information to be segmented into multiple code blocks and map a group of code blocks to be aligned with orthogonal frequency division multiplexing (OFDM) symbol boundaries such that efficient receiver processing can implement processing pipelining. In a second embodiment, the transmitter can provide more time or reduce complexity of the packet, such as by repetition of bits of code blocks of the encoded information or by reserving resource elements (REs) such that the receiver has effectively more time (or less complexity) to process the last or last few code blocks of the packet.

In a first embodiment, groups of code blocks within a transport block are aligned with OFDM symbol boundaries. By grouping the code blocks, the receiver can efficiently process the received information. Furthermore, an addition of a cyclic redundancy check (CRC) per group of code blocks allows the receiver to report back acknowledgement with more fidelity.

Regarding the second embodiment, and in order to provide sufficient time to the receiver to process transmission rates, three methods can be used to relax receiver processing time. A first method (referred to herein as method A) reduces available resource elements (REs) (and/or uses a lower modulation and a coding scheme) in a last or last few OFDM symbol(s). A second method (referred to herein as method B) adds physical layer padding to the last (or last few) OFDM symbols. A third method (referred to herein as method C) provides a physical gap by using extra non-data OFDM symbols at the end of the transmission.

For example, to provide transmitter based schemes (e.g., padding) in the transmission of a packet, such as by repetition of bits of code blocks of the encoded information or by reserving resource elements (REs) such that the receiver has effectively more time (or less complexity) to process the last or last few code blocks of the packet (e.g., these are the code blocks that have the most stringent trade-off in complexity and turnaround time). In one example, the amount of padding can be a function of transmission rate and can be negotiated between transmitter and receiver.

In UE signal processing, after data signal is received, the UE or device typically has a certain amount of time to perform demodulation and decoding to verify the correctness of the received bits and send an acknowledgement (ACK) of the correctly received bits. The time between end of data signal and transmission of acknowledgement is referred to as a turnaround time.

Improving turnaround time (i.e., reducing turnaround time) between received data channel and uplink ACK feedback can be difficult. It can be a complex trade-off between chip area cost versus additional required processing time cost (i.e., turnaround time). In some embodiments, turnaround time can include inverse fast fourier transform (IFFT), phase/amplitude compensation, equalization, interleaving, channel code decoding (e.g., LDPC decoding), medium access control (MAC) layer processing, and transmit preparation. For a given hardware design, a receiver can process higher data rates per slot with larger turnaround time. This can result in a trade-off between processing time and a supported data rate. In addition, supported memory size and memory access interface design can also impact processing time, which can add additional complexity to a trade-off decision.

In some embodiments, these techniques can also be applied for packets scheduled on the uplink, wherein the turnaround time can be considered as the time between reception of the last bit of an uplink transmission and scheduling of a retransmission of the same packet by a scheduler.

FIG. 1 is an example of a pipelined processing 100 of received data signal and transmission of acknowledgement (ACK). A user equipment (UE) or other device uses a pipelined approach to processing a received signal. Processing starts after enough of a signal is received (e.g., enough of a code block from an OFDM symbol 102, 104 and 106). As the OFDM symbol 102, 104 and 106 is received, the UE demodulates 116, 114, 112 and 110 the OFDM symbols 102, 104 and 106 into memory. The demodulated signal is read 118, 120, 122 and 124 from memory and decoding and writing the decoded data 134, 132, 130 and 128 is started after a first code block is ready in memory. After decoding of the OFDM symbols, a MAC process 126 determines whether to send an ACK or a negative acknowledgement (NACK) in UL OFDM symbol 108 within a turnaround time (measured from an end of the last OFDM symbol).

For example, assuming a total of N OFDM symbols for data, the receiver can start processing of a #N-3 symbol after complete reception of the #N-3 symbol. The receiver performs IFFT, equalization, demodulation, and de-interleaving (if it exists). The decoder reads the demodulated received bits for a decoding process. Transmit information is segmented into code blocks, where each code block is decoded separately (or a in a pipelined manner) by the receiver. The decoder has to read enough bits (or log-likelihood ratio values (LLRs)) of a code block for it to start the decoding process for the code block.

Two issues can be considered. First, for downlink transmissions, the turnaround time changes depending on any timing advance configured for UE (e.g., timing advance can reduce the turnaround time). Second, a decoding time is a function of a number of code blocks to process in a given unit of processing time. Because the code blocks are not specifically aligned with a symbol boundary, the mis-alignment can result in a slight variation in decoding processing time per OFDM symbol(s) in case of a pipelined decoder implementation.

Figure 2:
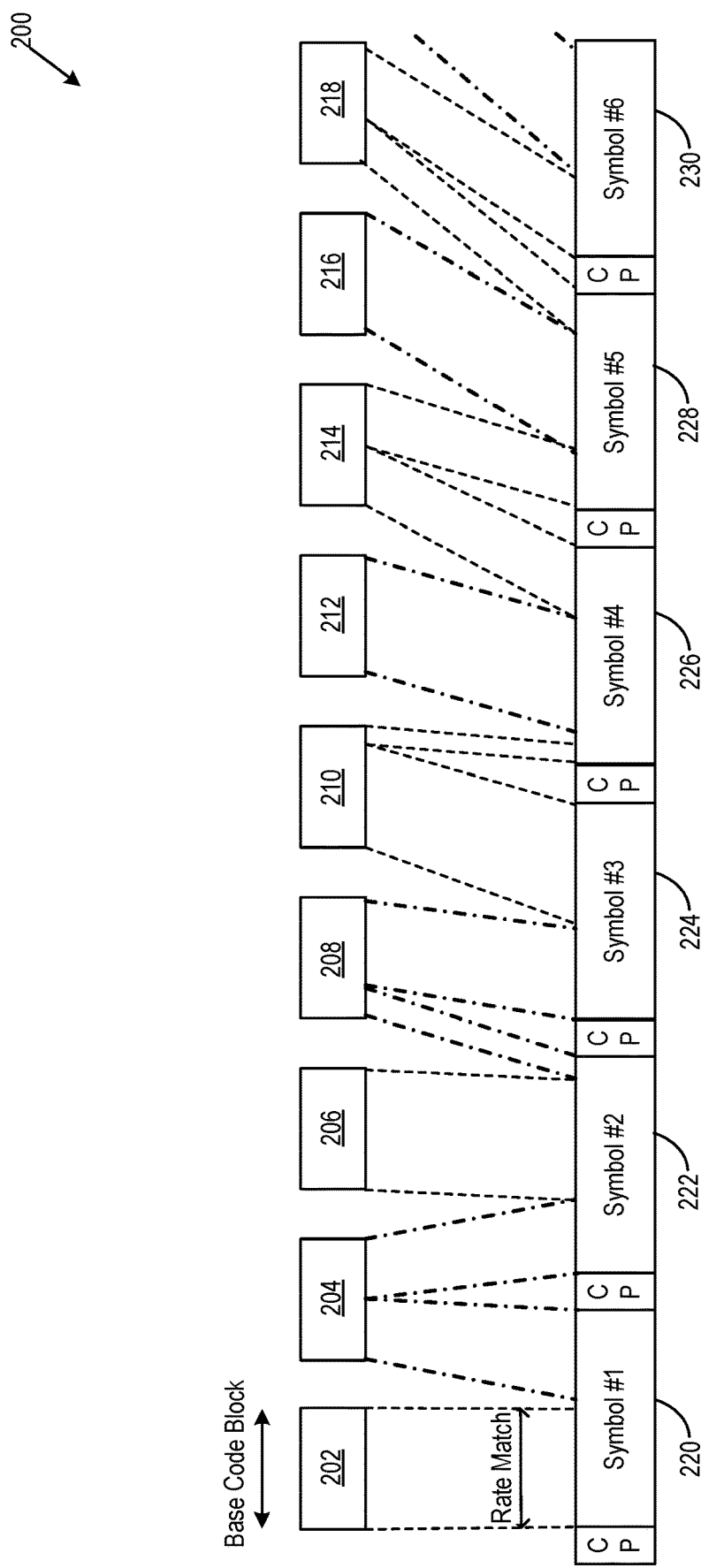
FIG. 2 is a diagram illustrating a transmitter information bit sequence segmented into sub-blocks consistent with embodiments disclosed herein.

FIG. 2 shows a transmitter information bit sequence 200 segmented into sub-blocks. Each sub-block is encoded (e.g., low-density parity-check (LDPC)) and turned into a base coded sub-block 202-218. Base coded sub-blocks are the encoded information bits of segmented information bits that are not rate matched. It may correspond to a mother code rate of the encoder (e.g., LDPC). After rate matching a base coded sub-block, rate-matched base coded sub-blocks are obtained and these are mapped to available resources in the assigned OFDM symbols 220-230.

A problem can arise in that a size of the rate-matched coded sub-block and allocated resource elements of an OFDM symbol are not typically identical. This allocation can lead to a non-integer number of code block mappings per OFDM symbol.

Figure 3:
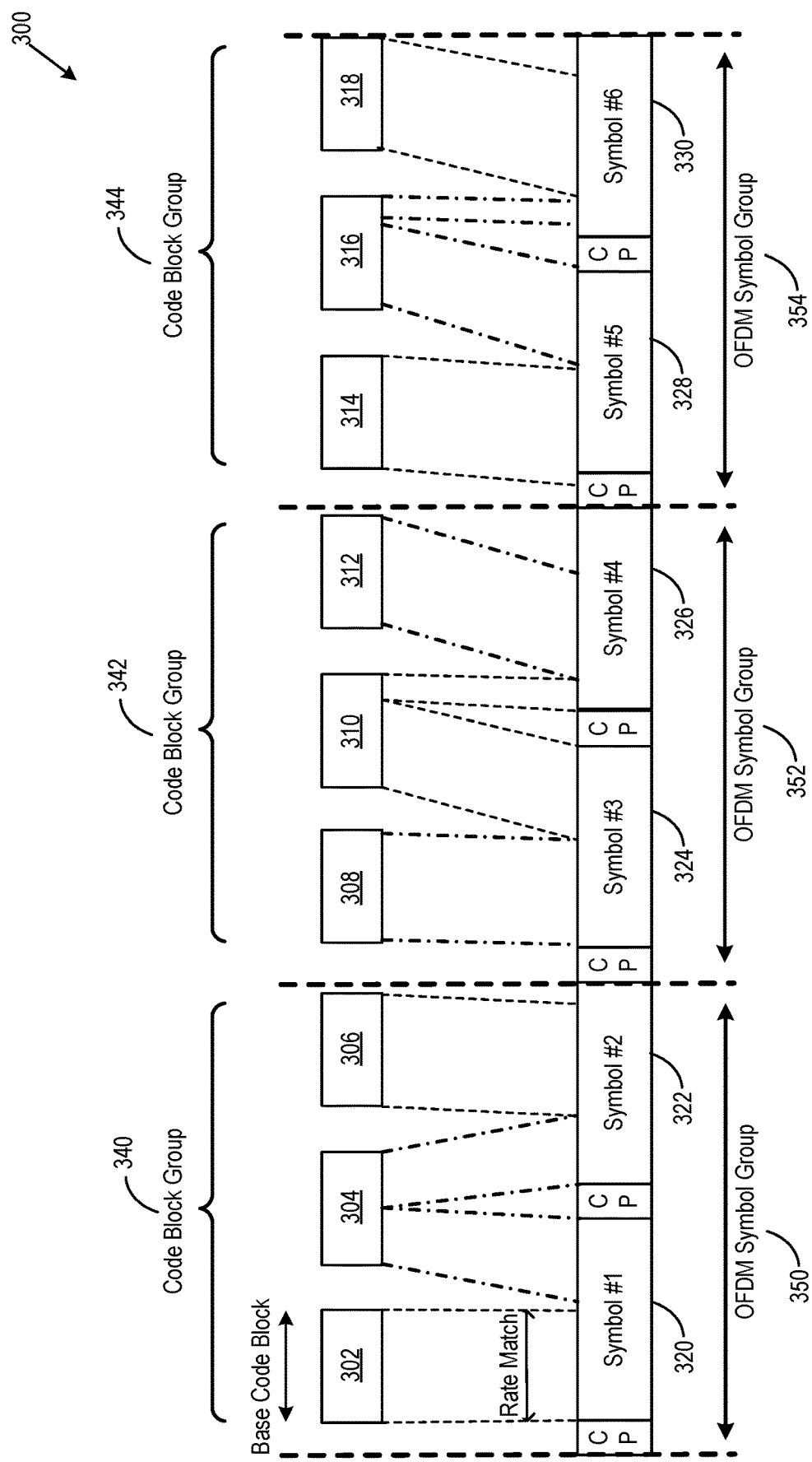
FIG. 3 is a block diagram of alignment of a code block group with an OFDM symbol group consistent with embodiments disclosed herein.

FIG. 3 is a block diagram of alignment of a code block group with an OFDM symbol group. N code blocks (e.g., 302, 304 and 306; 308, 310 and 312; or 314, 316 and 318), called a code block group 340, 342, 344, are aligned to M OFDM symbols (e.g., 320 and 322; 324 and 326; or 328 and 330), called an OFDM symbol group 350, 352 or 354. In one example, N and M can be 1. This results in a single code block mapped to a single OFDM symbol. This integer number of code block mapping to a group of OFDM symbols allows efficient pipelined process at the receiver. Furthermore, each group of code blocks can be associated with an acknowledgement bit. This results in multiple acknowledgement bits per transport block when the transport block has multiple groups of code blocks. It may be also possible to have a different number of code blocks (CB) in the code block group (CBG) and/or different code block sizes per CBG and/or each code block in each CBG may have a distinct size. For example, a transport block may have three code block groups CBG0, CBG1, CBG2, wherein code blocks CB0, CB1 are in CBG1; CB2-CB6 are in CBG1; and CB7-CB13 are in CBG2.

Figure 4:
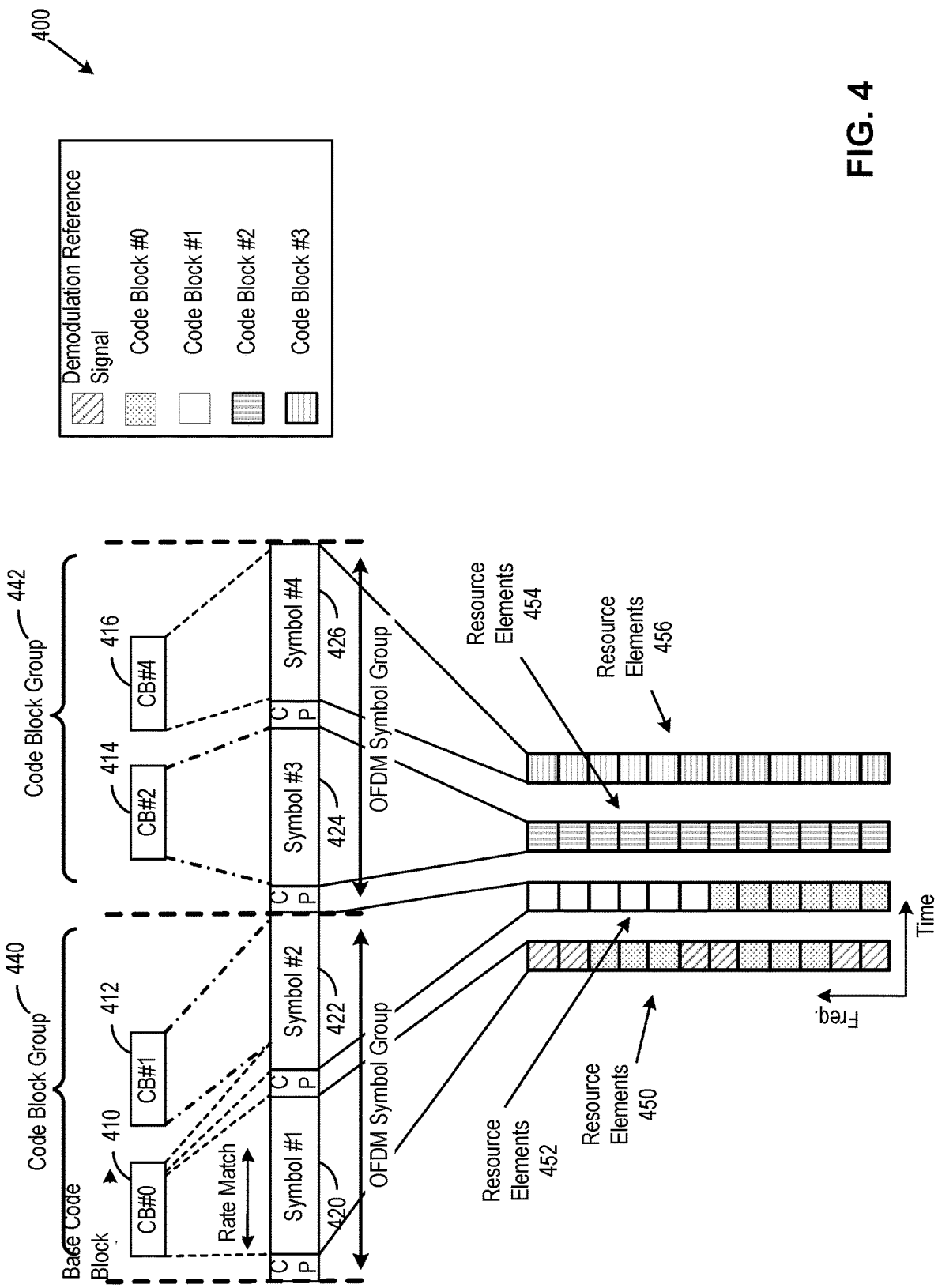
FIG. 4 is a diagram illustrating varying available resource elements per OFDM symbol consistent with embodiments disclosed herein.

FIG. 4 is a diagram 400 illustrating varying available resource elements (REs) 450, 452, 454 and 456 per OFDM symbol 420, 422, 424 and 426. Each OFDM symbol 420, 422, 424 and 426 of the allocated data transmission may have a different number of available REs for data transmission. If a code block group 440 or 442 (comprising base code blocks 410, 412, 414 and 416) is rate matched to always fit into M OFDM symbols 420, 422, 424 and 426, different code block groups 440, 442 can end up with different code rates. This may result in different link performance. This example of different OFDM symbols 420, 422, 424 and 426 containing a different number of allocated REs is shown in FIG. 4. In the example, the second code block group 442 is sent over more REs compared with the first code block group 440 due to the demodulation reference signal (DRS) utilizing a portion of the REs 450.

Figure 5:
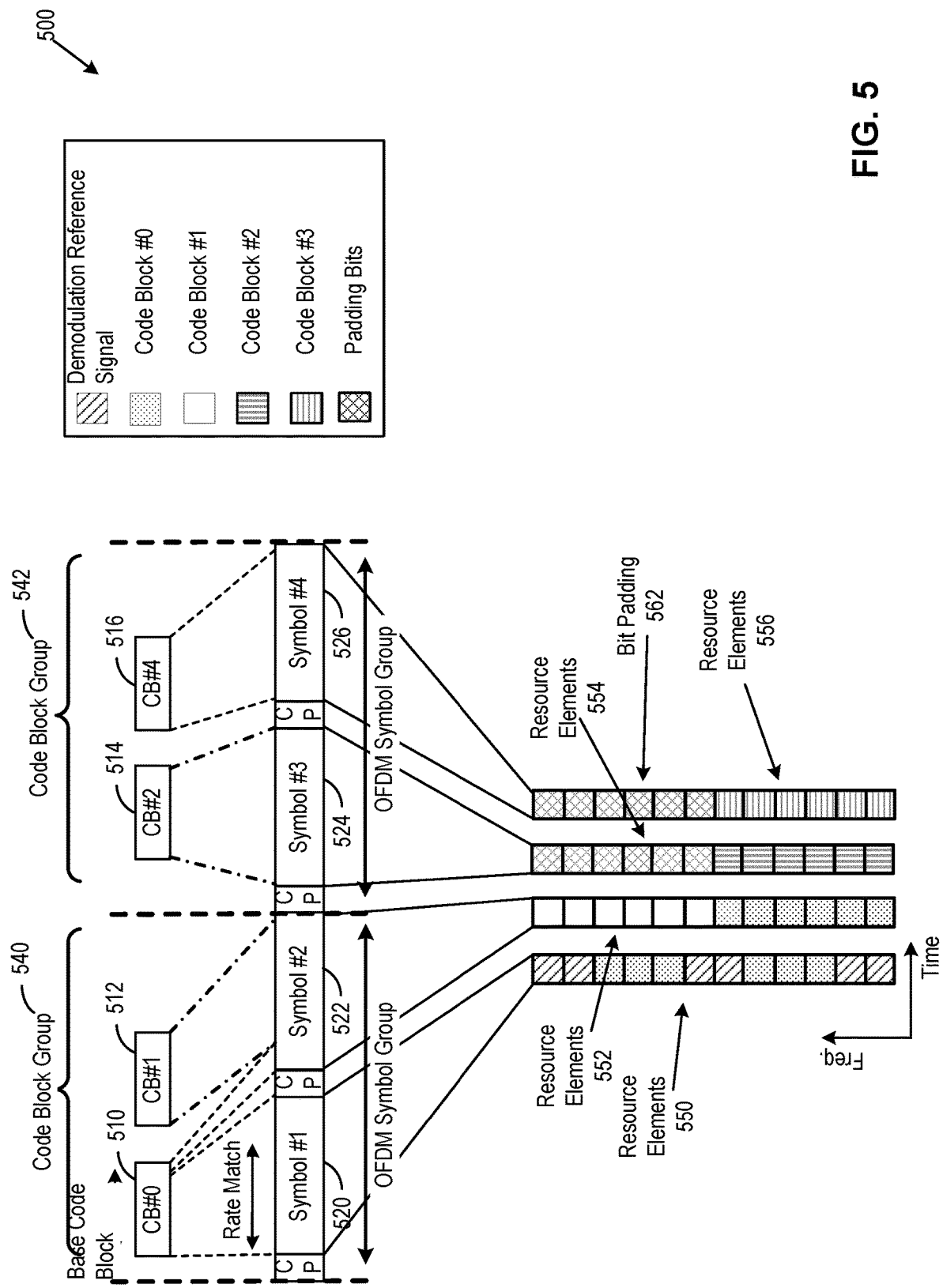
FIG. 5 is a block diagram illustrating bit padding to avoid variable code rate consistent with embodiments disclosed herein.

FIG. 5 is a block diagram 500 illustrating bit padding to avoid a variable code rate. To avoid a variable code rate within the transport block, bit padding 562 can be used such that code block groups 540 and 542 have similar effective code rates. The bit padding 562 can be done prior to the encoding, where known bit sequences (or bit sequences that could be computed from received and decoded bits prior to padding) are used for padding. Alternatively, bit padding 562 can be done after encoding and rate matching. The padded bits can be inserted in the front or end of each code block or inserted in the front end of the code block group 540 or 542 (that contains base code blocks 510, 512, 514 and 516). Another option is to use repetition instead of padding (e.g., repeat REs rather than unusable padded bits). Within a code block group 540 and 542, there may be further segmentation to align code blocks to the OFDM symbol 520, 522, 524 within OFDM symbol groups and 526 boundaries as well.

An alternative method to avoid a variable code rate within the transport block is to perform non-equal size information payload segmentation. In an embodiment, if a first code block group has smaller REs compared with the second code block group, information bits that are segmented to the first code block group may be smaller than the second code block group. For example, if CBG1 has 1 CB and 960 REs, and CBG2 has 2 CBs and 1000 REs/CB, and transmission is performed using a modulation coding scheme (MCS) of one half code rate and quadrature phase-shift keying (QPSK) modulation, and the transport block size (TBS) is 2960 bits, code block segmentation of the transport block can be 960 for the first CB1, 1000 for CB2 and CB3. The segmentation can use the modulation order and code rate to determine the segmentation size for each segment.

A determination of the code block group size and the OFDM symbol group size can be determined by the receiver capability and signaled by control signals. Configurable code block segmentation can also be used, wherein the code block segmentation applied on a particular transmission (for a transport block or a service) or a link (e.g., downlink/uplink) can be explicitly configured, e.g., by a network entity such as a base station. Thus, the configurable segmentation allows segmentation to support a fast pipelined operation in case of low-latency/fast turnaround, while it can also support an operation where balanced performance (across all code blocks) is targeted with a somewhat relaxed processing requirement.

A number of code block groups may be configured via higher layer or physical layer signaling. In some embodiments, the number of code block groups may be associated with the configuration of a slot duration and a number of subslots associated with a single slot duration.

Figure 6:
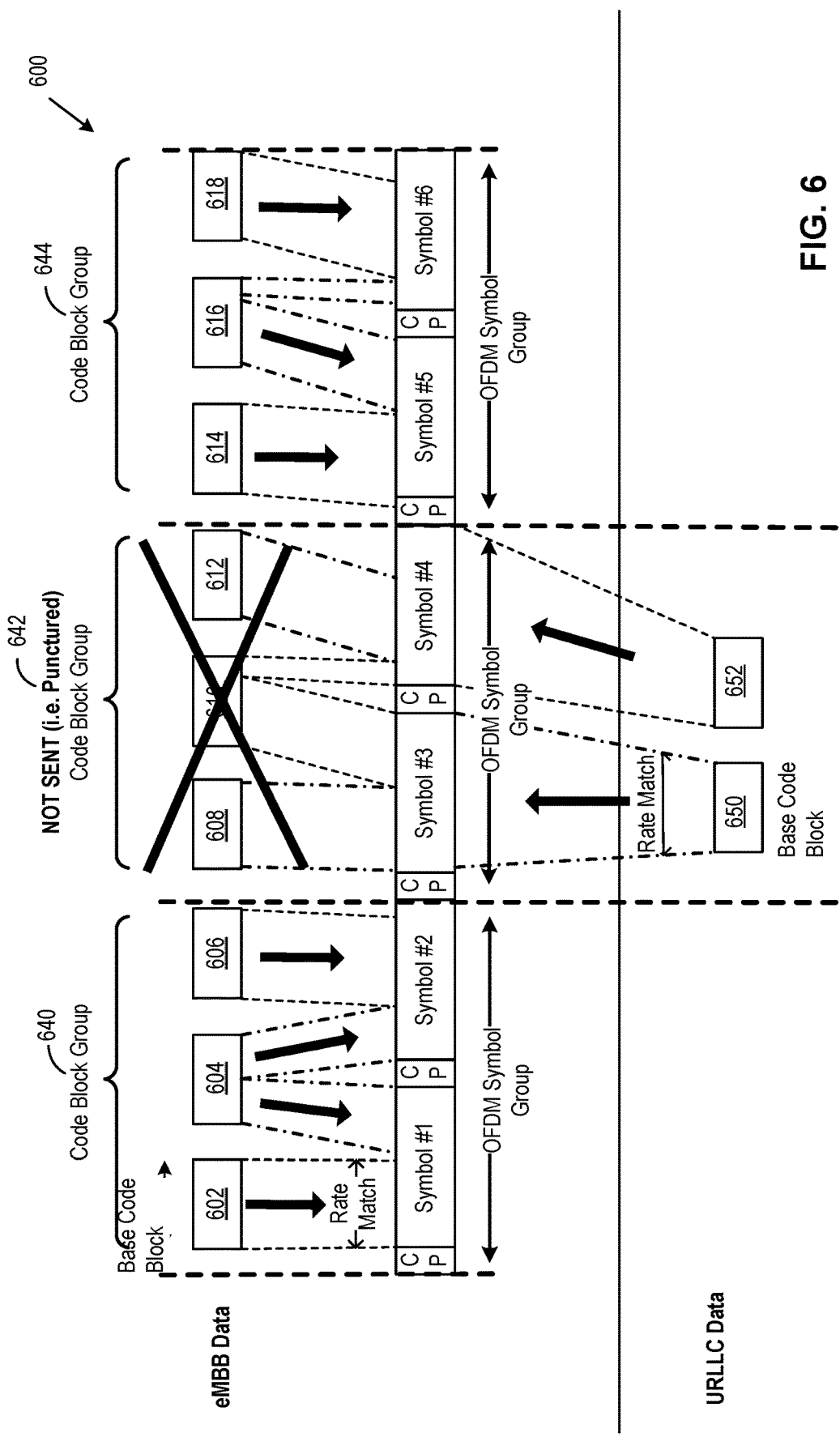
FIG. 6 is a diagram illustrating transmission of an urgent data delivery consistent with embodiments disclosed herein.

FIG. 6 is a diagram illustrating transmission 600 of an urgent data delivery. Because acknowledgements can be generated for each code block group 640, 642 and 644, it may be possible for the transmitter to omit the transmission of a code block group 642 and transmit data signals 650 and 652 for another receiver that requires much more urgent data delivery. It also allows a transmitter to omit retransmission of a code block group 642 that is already successfully received by the receiver. The omission of such code block group 642 can be signaled by the transmitter. One example of the signaling is done in the padding bits of the code block group 640 prior to the code block group omission 642.

Figure 7:
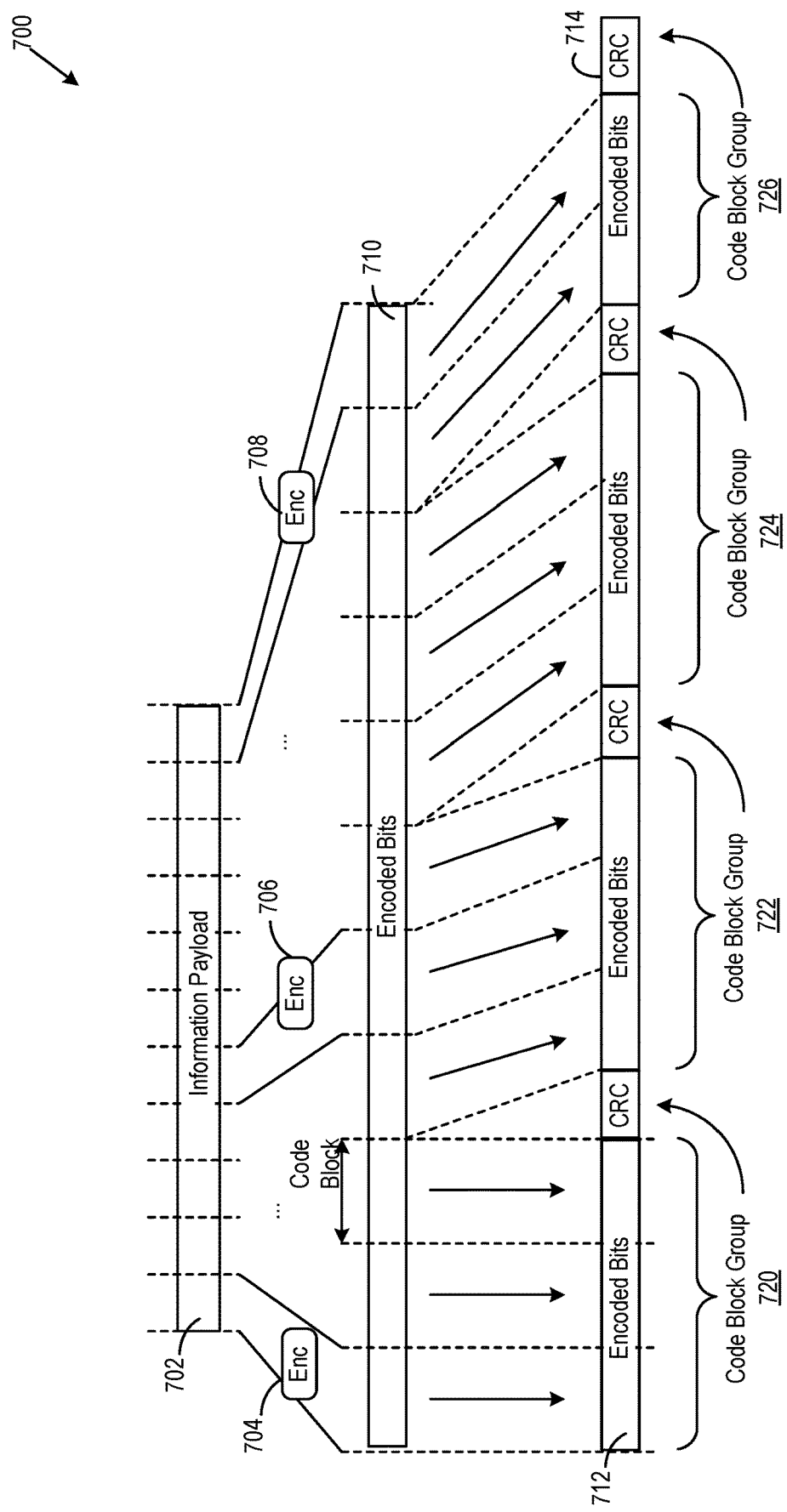
FIG. 7 is a diagram illustrating transmission of a cyclic redundancy check (CRC) with a code block group consistent with embodiments disclosed herein.

FIG. 7 is a diagram illustrating transmission of a cyclic redundancy check (CRC) with a code block group. Alternatively, an omission of the code block group by the receiver can be done by checking the cyclic redundancy check (CRC) of the information bits of a code block group. A transmitter can compute a CRC of each code block group and append the computed CRC bits to an end of the code block group prior to encoding.

Figure 8:
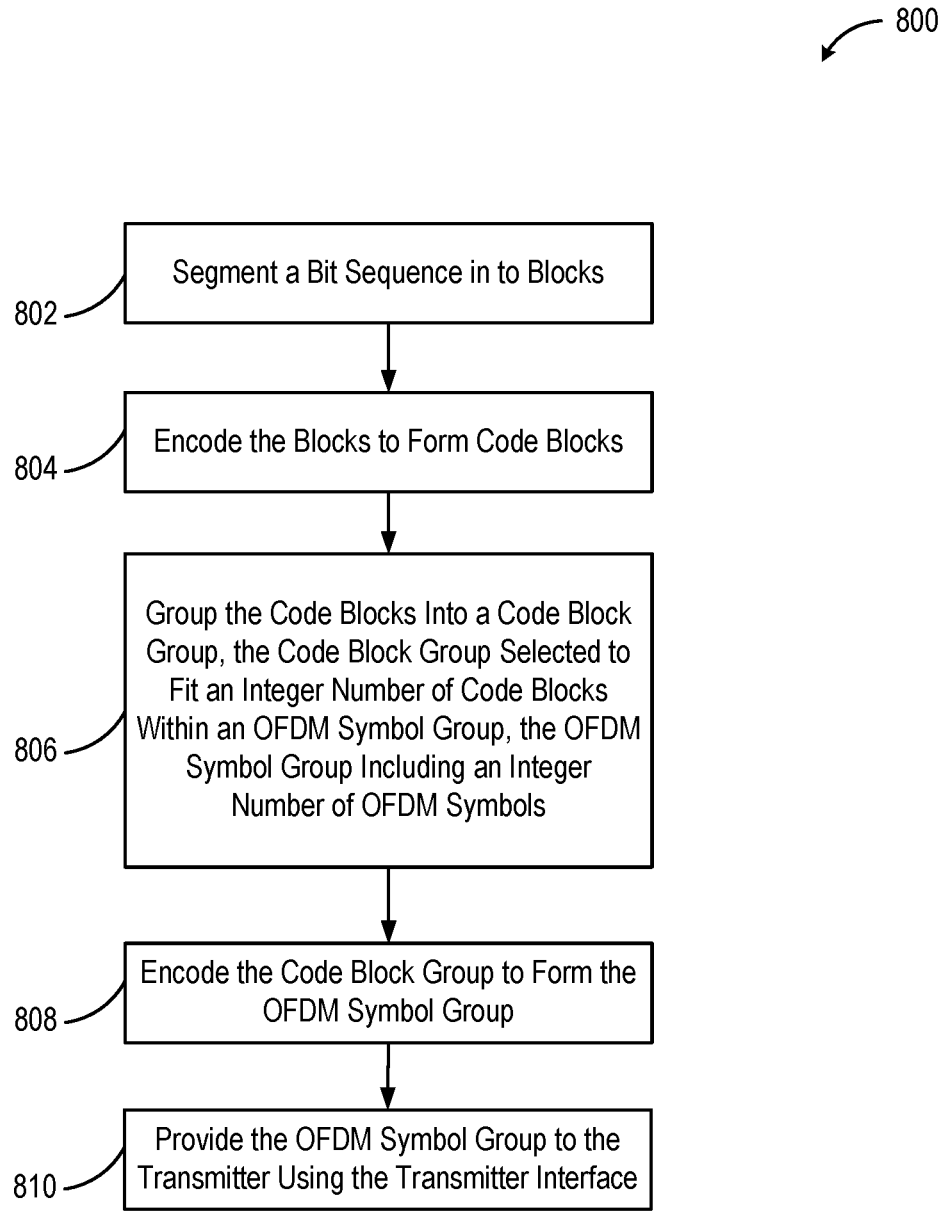
FIG. 8 is a flow chart illustrating a method for code block alignment with OFDM symbol boundaries consistent with embodiments disclosed herein.

FIG. 8 is a flow chart illustrating a method 800 for code block alignment with OFDM symbol boundaries consistent with embodiments disclosed herein. The method 800 can be accomplished by systems such as those shown in FIGS. 1 and 16, including UE 1602 and RAN node 1612. In block 802, a RAN node segments a bit sequence into blocks. In block 804, the RAN node encodes the blocks to form code blocks. In block 806, the RAN node groups the code blocks into a code block group, the code block group selected to fit an integer number of code blocks within an OFDM symbol group, the OFDM symbol group including an integer number of OFDM symbols. In block 808, the RAN node encodes the code block group to form the OFDM symbol group. In block 810, the RAN node provides the OFDM symbol group to the transmitter using the transmitter interface.

Figure 9:
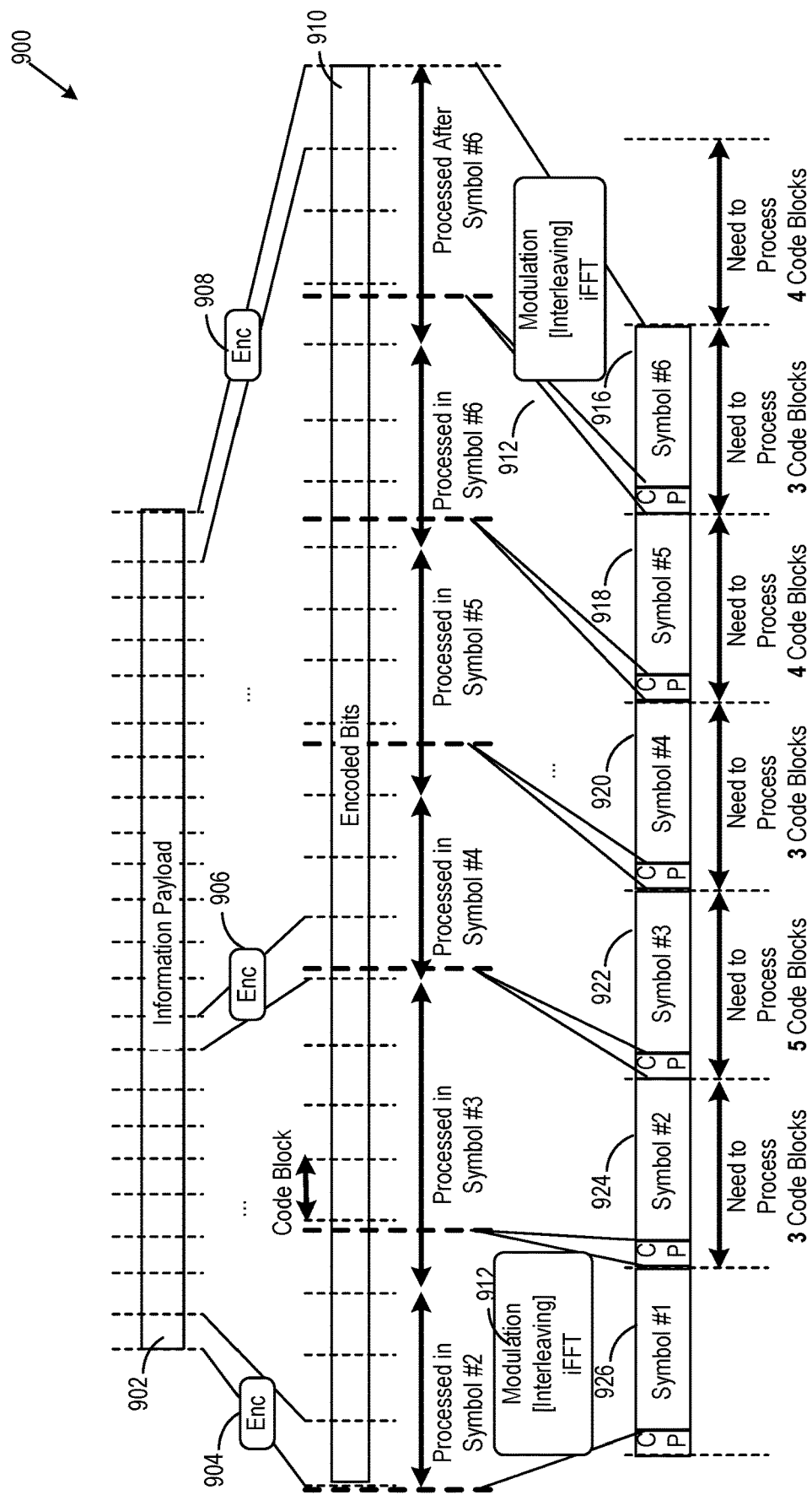
FIG. 9 is a diagram illustrating a pipelined processing of mis-aligned code blocks with OFDM symbols consistent with embodiments disclosed herein.

FIG. 9 is a diagram illustrating a pipelined processing of mis-aligned code blocks 902 with OFDM symbols 926, 924, 922, 920, 918 and 916. The figure shows a varying number of OFDM symbols that are scheduled to be processed due to mis-alignment of code block and OFDM symbol boundaries, assuming the receiver is trying to process all code blocks 902 contained within a single OFDM symbol. Information bits (e.g., a transport block or a code block group) can be segmented into code blocks 902 that may be subsequently encoded 912 and rate matched prior to transmission (for brevity, this document uses code block without explicitly showing other operations such as encoding a code block, etc.). The code blocks 906 are concatenated and transmitted. At the receiver, the received signal is split into code blocks 906 (or modulation symbols/LLRs associated with code blocks) and decoded. Because of the mis-alignment of the code blocks 906 with respect to the OFDM symbol boundary, the receiver may need to process more code blocks 906 in some OFDM symbols 926, 924, 922, 920, 918 and 916 than others, thereby creating imbalance in processing complexity as well as potential issues in the ability to conform to latency requirements.

Due to limits of implementation, certain receivers may not be able to meet a turnaround time configured for certain transmission rates. Generally, if there are more code blocks 902 in a transmission, more processing time is used by the receiver. In order to provide sufficient time to the receiver to process transmission rates, three methods can be used to relax the required receiver process time. A first method (referred to herein as method A) reduces available resource elements (REs) (and/or uses a lower modulation and a coding scheme) in a last or last few OFDM symbol(s). A second method (referred to herein as method B) adds physical layer padding to the last (or last few) OFDM symbols. A third method (referred to herein as method C) provides a physical gap by using extra non-data OFDM symbols at the end of the transmission.

Figure 10:
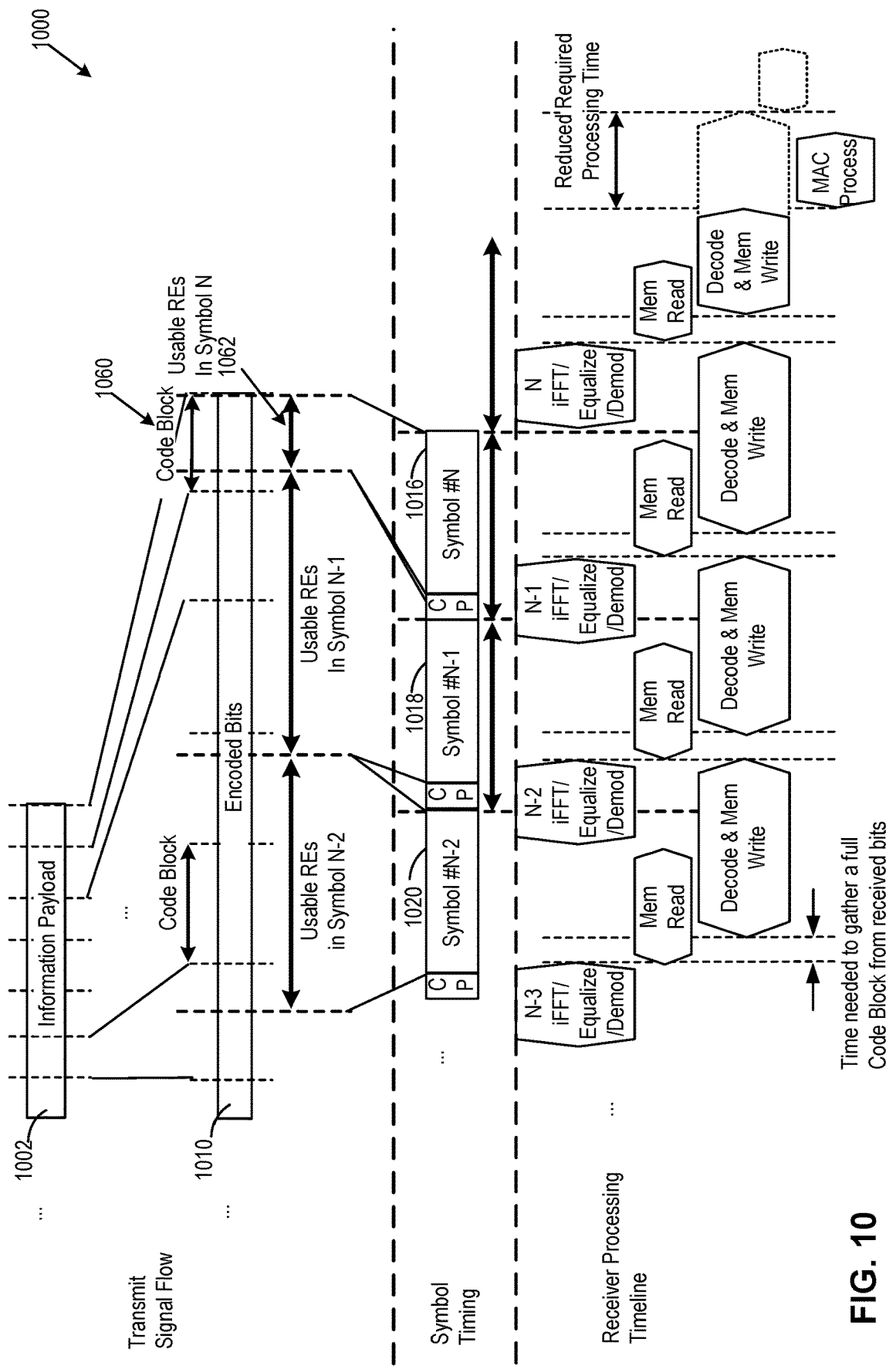
FIG. 10 is a diagram illustrating a first method to relax receiver processing time using a reduction of available resource elements (REs) consistent with embodiments disclosed herein.

FIG. 10 is a diagram illustrating a first method to relax receiver processing time using a reduction of available resource elements (REs) (which is referred to as Method A herein). Method A uses reduced available REs (and/or a lower modulation and a coding scheme) in the last (or last few) OFDM symbol 1016 used for packet transmission to reduce receiver processing time. In method A, a transmitter configures a lesser number of REs 1062 in a last OFDM symbol 1016 (or last few OFDM symbols) for high data rates (or high rate-equivalent metric). Because each RE contains a single modulated constellation symbol (e.g., for each spatial layer), a relatively small number of information bits 1002 will be mapped in the last OFDM symbol (or last few OFDM symbols). This can reduce the number of code blocks 1060 (or code block size) to process at the receiver near the end of the transmission. This reduction effectively provides relaxation in the required processing time. The amount of the REs reduced can be a function of data rate, where this information can be negotiated between the transmitter and receiver during network association via capability signaling.

The unused REs for data signals can be used for transmitting additional reference signals used for radio resource measurements, channel state information measurements, or channel estimation for demodulation. Alternatively, they can be used for other control signals or used for scheduling another user. Additionally, the unused REs for can be in the form of empty REs (e.g., zero powered REs). The downlink control information can be used to indicate one or more sets of empty REs or non-data REs in an allocation, wherein such signaling may be configured based on UE capability and the transmission data rate, which can comprise modulation, effective code rate (e.g., after HARQ combining), number of layers (i.e., rank), number of OFDM symbols (or REs) for transmission, and payload size. The number of non-data REs can be larger than the minimum required by the UE processing capability. Or the effective data rate in the last (or last few) symbols shall be upper bounded by the maximum effective edge data rate indicated by the UE signaling.

Figure 11:
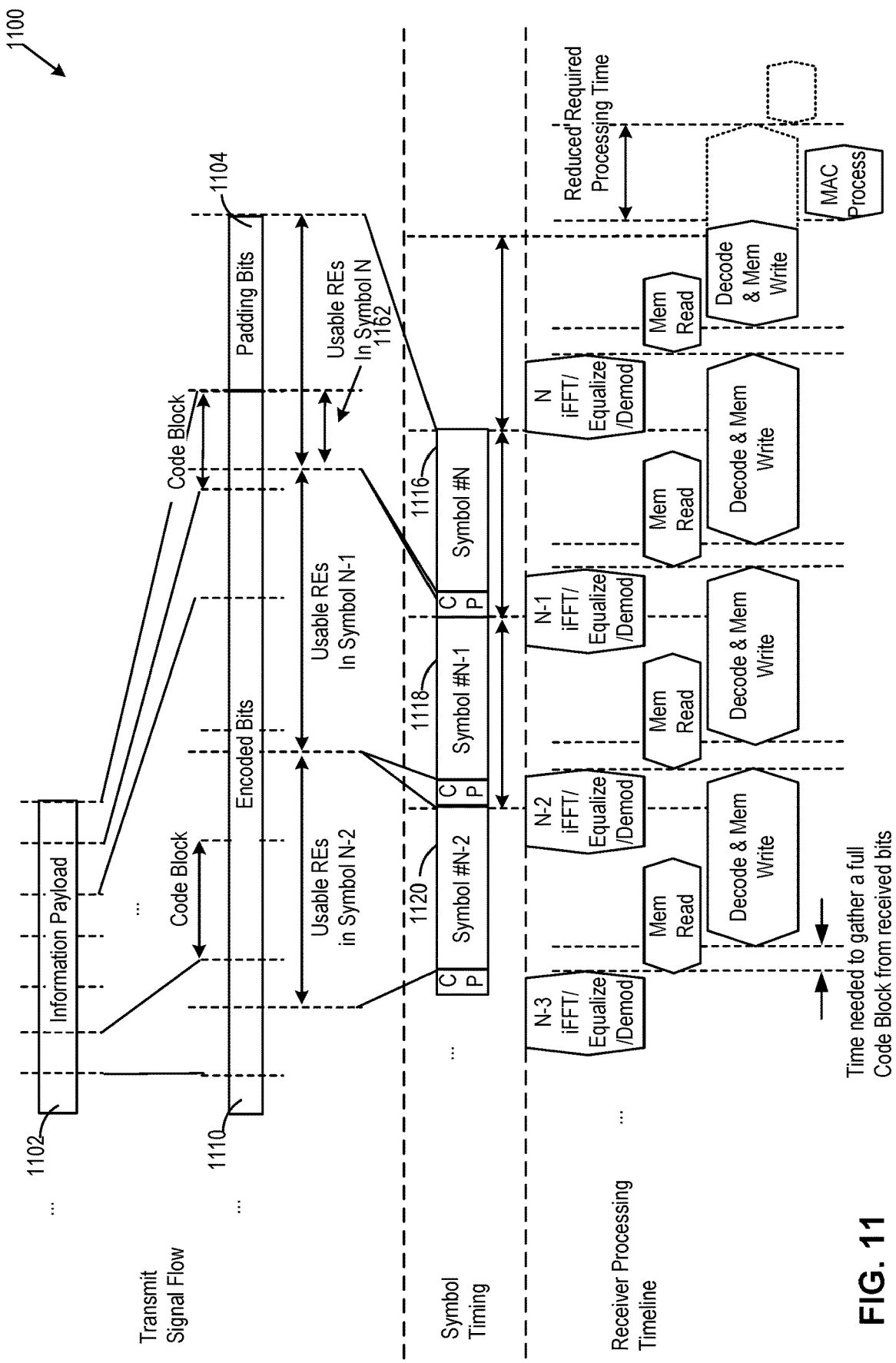
FIG. 11 is a block diagram illustrating a second method to relax receiver processing time using physical layer padding to the last (or last few) OFDM symbols consistent with embodiments disclosed herein.

FIG. 11 is a block diagram illustrating a second method to relax receiver processing time using physical layer padding to the last (or last few) OFDM symbols. In an embodiment, the padding can be done prior to the encoding process or post encoding process. In the method B, a transmitter sends padding bits 1104 along with encoded information bits in the last (or last few) OFDM symbols for high data rates (or high rate-equivalent metric). For example, the padding bits 1104 can be placed at the end of the encoded information bits.

In some embodiments, the padding bits 1104 can be either repetition of the encoded bits of the last (or last few) code blocks of the transmission, or dummy information. The dummy information padding can be performed at the end of the information payload to effectively reduce number of code blocks mapped to the last few OFDM symbols 1116 and/or 1118. Padding can be performed prior to either the encoding process or the decoding process. If the padding is performed prior to the encoding process, the dummy information padding can generate a new code block and is not multiplexed with information bits within the same code block. If the padding is performed after the encoding process, the padding bits can be generated from a pseudo-random sequence generator or be a repetition of the encoded bits of the last (or last few) code blocks. The receiver may be able to combine the repeated encoded bits during code blocks to improve decoding performance and reduce the number of iterations for decoding when LDPC is used as the encoding scheme.

Figure 12:
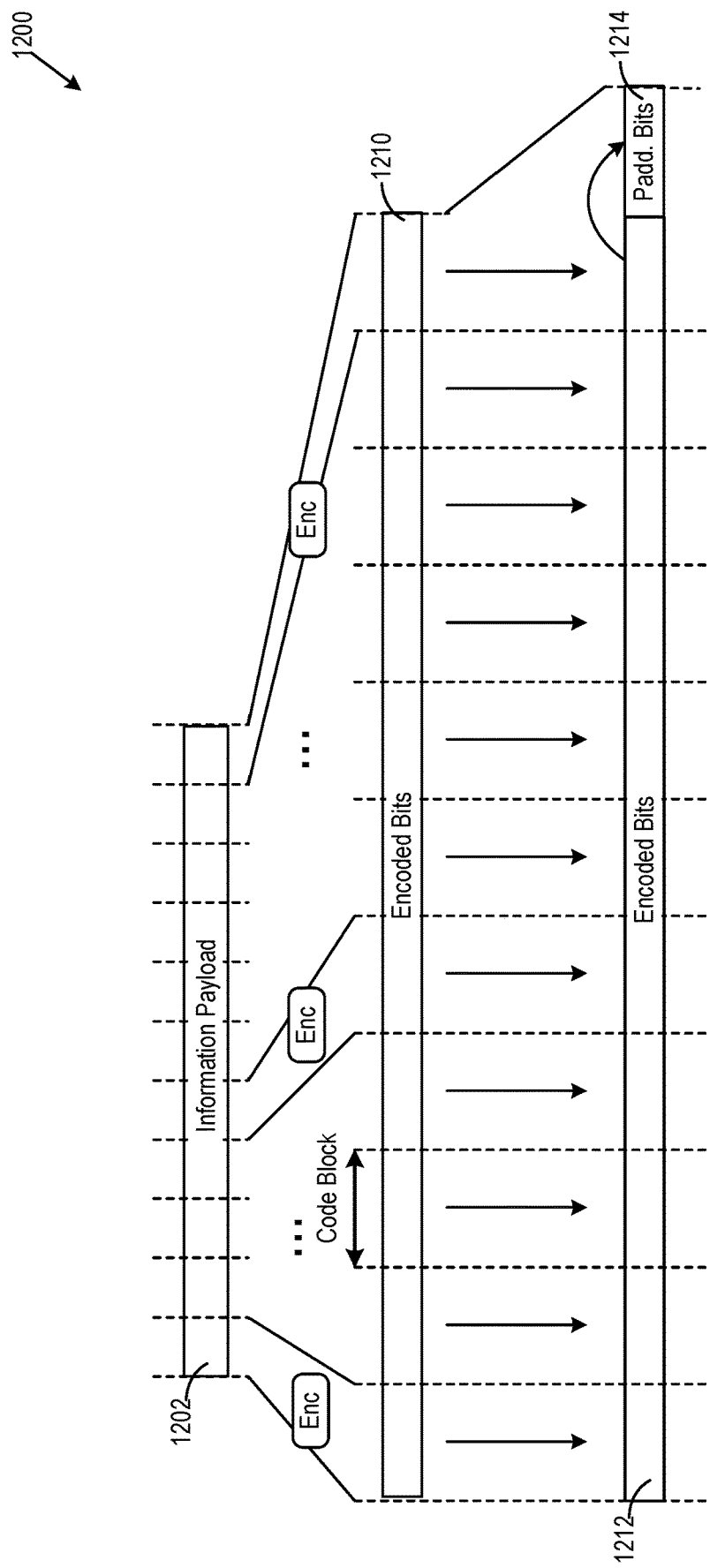
FIG. 12 shows an example embodiment that uses the bits of a last code block repeated as padding bits of the transmission consistent with embodiments disclosed herein.

FIG. 12 shows an example embodiment that uses the bits of a last code block repeated as padding bits 1214 of the transmission 1200. Note that when the padding bits 1214 are generated from repetition of code blocks 1210 of the encoded information bits 1202, an effective code rate of each code block 1212 of the transmission may not be similar. Placements of code blocks 1212 in the transmission according to its effective code rate is an alternative formulation of the padding method. The last (or last few) code blocks 1210 have a lower effective code rate, which acts as extra repetition padding compared to other code blocks 1212.

The padding can be also be performed in units of modulated constellation symbols (or group of modulated constellation symbols). The information payload can be rate matched to an integer number of REs. Two methods can be used to indicate padding information to a receiver. In a first option, the transmitter can place a special delimiter (e.g., signature) at the end of each code block and signal the end of information payload and start of dummy information padding. If the receiver detects such special delimiter, it can stop the decoding process. In a second option, the transmitter can signal a control signal that tells the UE the padding amount at the last (or last few) OFDM symbol(s). In order to reduce signaling overhead this can be a form of quantized values of padding size (in terms of bits either prior to encoding or post encoding) or a percentage of REs available in the last (or last few) OFDM symbol(s).

In an embodiment where the padding bits are generated with repetition of code blocks of the encoded information bits, the transmitter additionally performs either a bit or modulated constellation symbol level scrambling to avoid repeated sequences of information. This scrambling avoids high peak power to average power ratio (PAPR) in the signals with repetition in OFDM systems.

Figure 13:
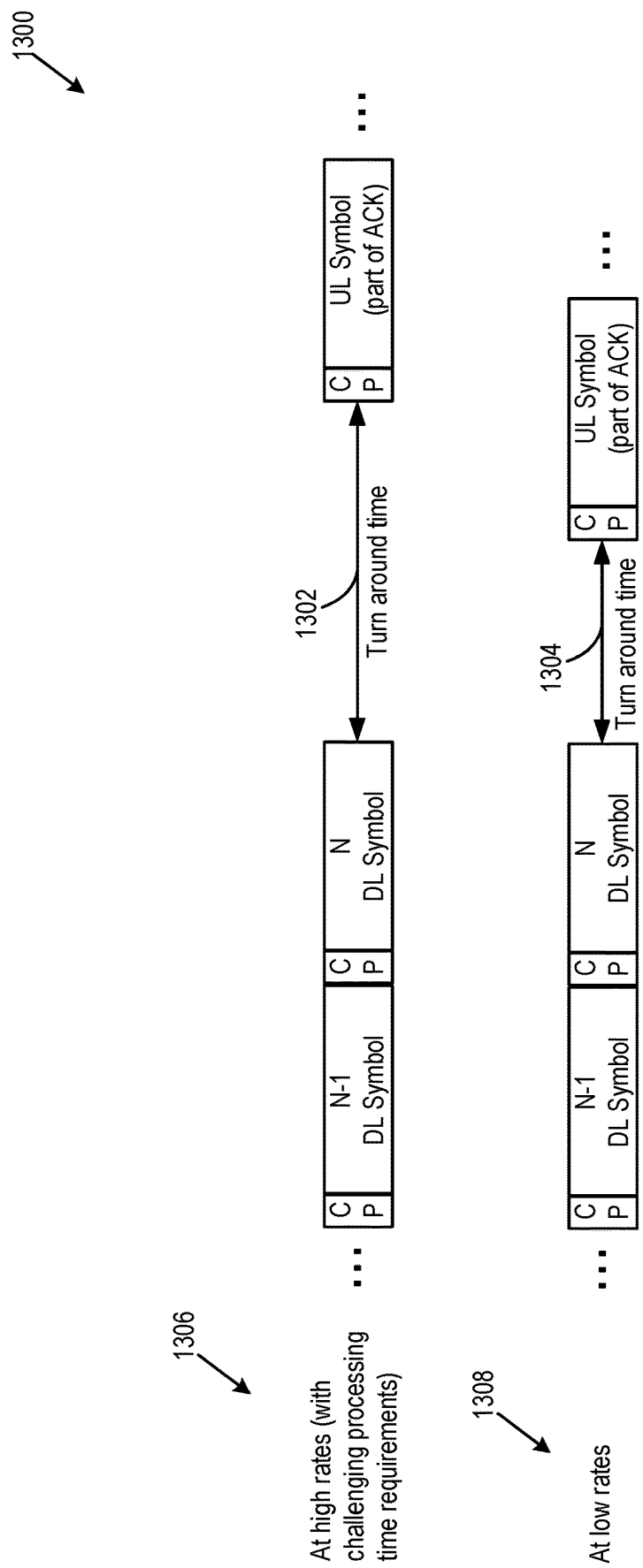
FIG. 13 is a block diagram illustrating a third method to relax receiver processing time using extra non-data OFDM symbols at the end of the transmission consistent with embodiments disclosed herein.

FIG. 13 is a block diagram illustrating a third method to relax receiver processing time using extra non-data OFDM symbols at the end of the transmission. A third method to relax receiver processing time is to use extra non-data OFDM symbols at the end of the transmission (which is referred to as method C herein). In the method C, a transmitter configures different turnaround time 1302 and 1304 for different data rates 1306 and 1308 (or high rate-equivalent metric). A turnaround time variation can be provided in units of OFDM symbols. This can be performed by placement of non-data signals, such as channel state information reference signals (CSI-RS), or control signals in the OFDM symbols after the data OFDM symbols while maintaining the same time-gap between transmission of the data/control/reference signal and acknowledgement.

Compared to methods A and B, providing a same gap for all transceivers in multi-user transmission (in the form of either OFMDA or MU-MIMO) can be challenging. In such scenarios, a gap should be determined by the capability of the most processing time challenged receiver (in the downlink case this is likely the UE), and signaled via downlink control signaling.

In some embodiments to efficiently support methods A, B, and C, a maximum supported rate and required turnaround time capability signaling can be defined. The following are embodiments of the capability signaling. The UE signals maximum supported rates it can process for each turnaround time range. The UE signals maximum allowed timing advance configured for uplink transmission for a maximum supported rate. Based on the capability signaling the transmitter provides variable gap (by physical time gap, padding, or reduced data RE in the last (or last few) OFDM symbol) to provide sufficient turnaround time for the receiver. The turnaround time gap can be dynamically signaled in the downlink control signal either explicitly or implicitly. Implicit signaling is when the turnaround time gap is determined by the allocated resources, configured modulation order and code rate, and the payload size of the transmission.

Figure 14:
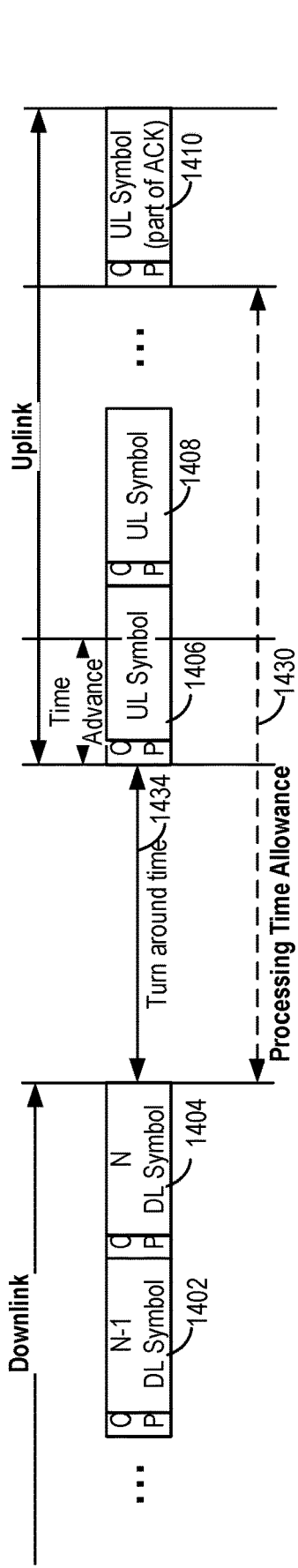
FIG. 14 is a block diagram illustrating processing time allowance consistent with embodiments disclosed herein.
Figure 14:
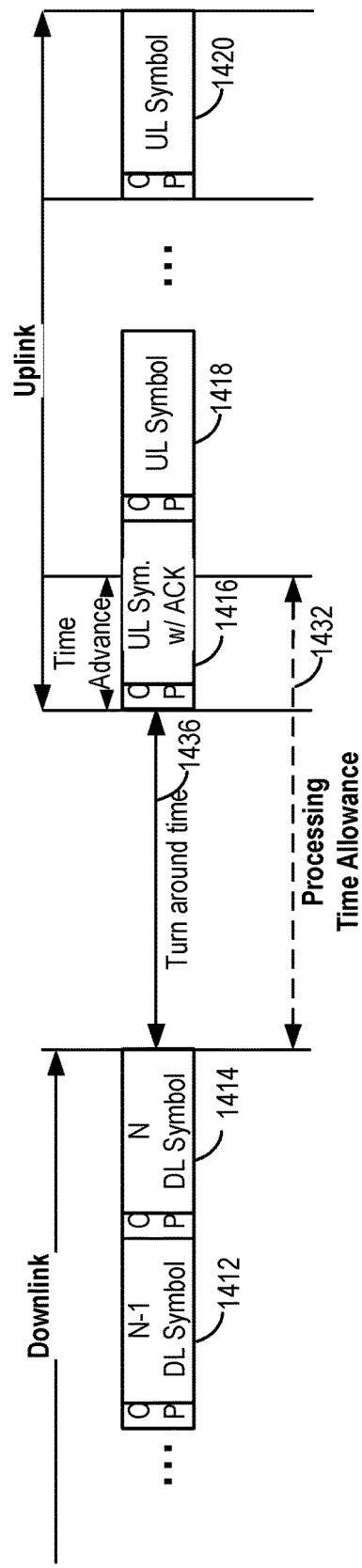

FIG. 14 is a block diagram illustrating processing time allowance 1430 and 1432 consistent with embodiments disclosed herein. The amount of processing time allowance is the time the receiver has to finish processing the transmitted signal and generate acknowledgement. Depending on the time position of the acknowledgement signal within the response signal, the receiver has different processing time allowances. For example, if the receiver is the UE, the processing time allowance is the time between the last downlink OFDM symbol 1404 or 1414 and the uplink OFDM symbol, which carries the acknowledgement signal 1410 or 1416 (including the time advance). The maximum data rate the receiver can process can be based on the turnaround time itself 1434 or 1436 or it can be based on the processing time allowance 1430 or 1432. Case 1 in FIG. 14 has a longer processing time allowance compared with case 2, and therefore the UE may be able to process at a higher data rate before the ACK feedback.

The maximum transmit/supported rate described can be replaced with a rate-compatible metric. Examples of rate-compatible metrics are an average number of code blocks per OFDM symbol of the data transmission, the number of code blocks in the last M OFDM symbols of the data transmission, rounded up to the maximum number of code blocks in any OFDM symbol of the data transmission, or combinations of transmit rank, MCS, and allocated REs.

Figure 15:
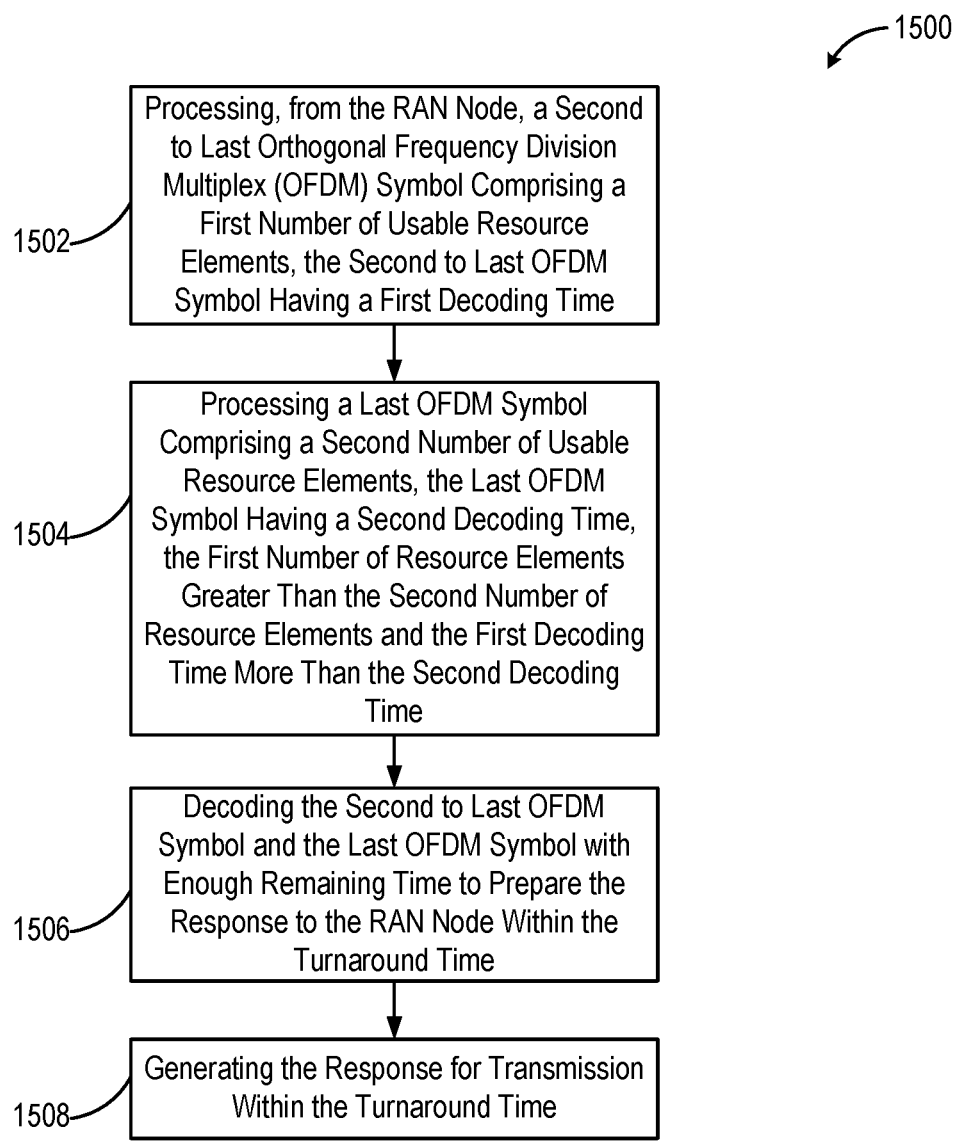
FIG. 15 is a flow chart illustrating a method for reducing processing complexity by reducing useable resource elements of a final code block consistent with embodiments disclosed herein.
Figure 16:
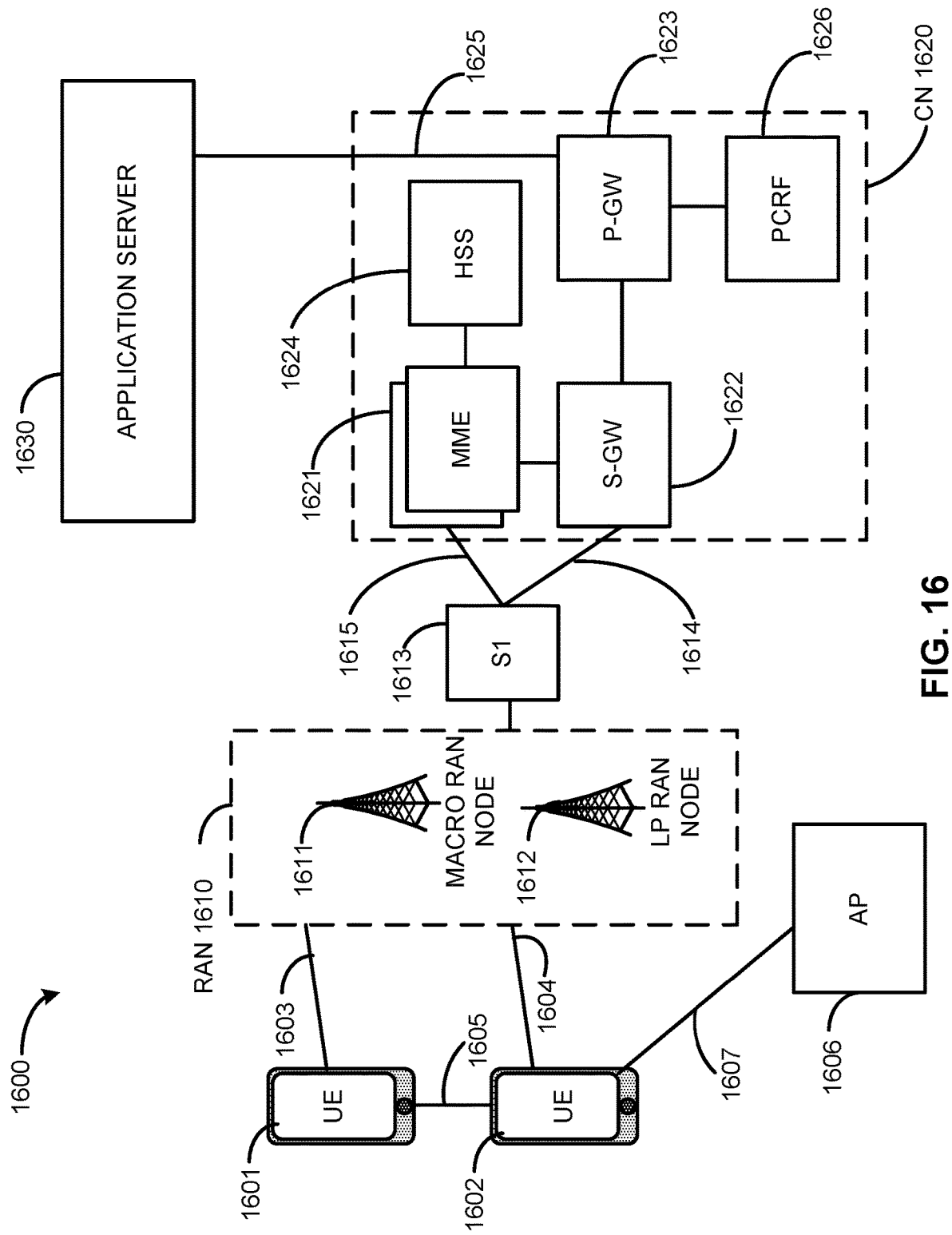
FIG. 16 illustrates an architecture of a system of a network consistent with embodiments disclosed herein.

FIG. 15 is a flow chart illustrating a method 1500 for reducing processing complexity by reducing useable resource elements of a final code block. The method can be accomplished by systems such as shown in FIGS. 1 and 16, including UE 1602 and RAN node 1612. In block 1502, a UE processes, from the RAN node, a second to last orthogonal frequency-division multiplex (OFDM) symbol comprising a first number of usable resource elements, the second to last OFDM symbol having a first decoding time. In block 1504, a UE processes a last OFDM symbol comprising a second number of usable resource elements, the last OFDM symbol having a second decoding time, the first number of resource elements greater than the second number of resource elements and the first decoding time more than the second decoding time. In block 1506, a UE decodes the second to last OFDM symbol and the last OFDM symbol with enough remaining time to prepare the response to the RAN node within the turnaround time. In block 1508, a UE generates the response for transmission within the turnaround time.

FIG. 16 illustrates an architecture of a system 1600 of a network in accordance with some embodiments. The system 1600 is shown to include a user equipment (UE) 1601 and a UE 1602. The UEs 1601 and 1602 are illustrated as smartphones (e.g., handheld touchscreen mobile computing devices connectable to one or more cellular networks), but may also comprise any mobile or non-mobile computing device, such as Personal Data Assistants (PDAs), pagers, laptop computers, desktop computers, wireless handsets, or any computing device including a wireless communications interface.

In some embodiments, any of the UEs 1601 and 1602 can comprise an Internet of Things (IoT) UE, which can comprise a network access layer designed for low-power IoT applications utilizing short-lived UE connections. An IoT UE can utilize technologies such as machine-to-machine (M2M) or machine-type communications (MTC) for exchanging data with an MTC server or device via a public land mobile network (PLMN), Proximity-Based Service (ProSe) or device-to-device (D2D) communication, sensor networks, or IoT networks. The M2M or MTC exchange of data may be a machine-initiated exchange of data. An IoT network describes interconnecting IoT UEs, which may include uniquely identifiable embedded computing devices (within the Internet infrastructure), with short-lived connections. The IoT UEs may execute background applications (e.g., keep-alive messages, status updates, etc.) to facilitate the connections of the IoT network.

The UEs 1601 and 1602 may be configured to connect, e.g., communicatively couple, with a radio access network (RAN) 1610. The RAN 1610 may be, for example, an Evolved Universal Mobile Telecommunications System (UMTS) Terrestrial Radio Access Network (E-UTRAN), a NextGen RAN (NG RAN), or some other type of RAN. The UEs 1601 and 1602 utilize connections 1603 and 1604, respectively, each of which comprises a physical communications interface or layer (discussed in further detail below); in this example, the connections 1603 and 1604 are illustrated as an air interface to enable communicative coupling, and can be consistent with cellular communications protocols, such as a Global System for Mobile Communications (GSM) protocol, a code-division multiple access (CDMA) network protocol, a Push-to-Talk (PTT) protocol, a PTT over Cellular (POC) protocol, a Universal Mobile Telecommunications System (UMTS) protocol, a 3GPP Long Term Evolution (LTE) protocol, a fifth generation (5G) protocol, a New Radio (NR) protocol, and the like.

In this embodiment, the UEs 1601 and 1602 may further directly exchange communication data via a ProSe interface 1605. The ProSe interface 1605 may alternatively be referred to as a sidelink interface comprising one or more logical channels, including but not limited to a Physical Sidelink Control Channel (PSCCH), a Physical Sidelink Shared Channel (PSSCH), a Physical Sidelink Discovery Channel (PSDCH), and a Physical Sidelink Broadcast Channel (PSBCH).

The UE 1602 is shown to be configured to access an access point (AP) 1606 via connection 1607. The connection 1607 can comprise a local wireless connection, such as a connection consistent with any IEEE 802.11 protocol, wherein the AP 1606 would comprise a wireless fidelity (WiFi®) router. In this example, the AP 1606 may be connected to the Internet without connecting to the core network of the wireless system (described in further detail below).

The RAN 1610 can include one or more access nodes that enable the connections 1603 and 1604. These access nodes (ANs) can be referred to as base stations (BSs), NodeBs, evolved NodeBs (eNBs), next Generation NodeBs (gNB), RAN nodes, and so forth, and can comprise ground stations (e.g., terrestrial access points) or satellite stations providing coverage within a geographic area (e.g., a cell). The RAN 1610 may include one or more RAN nodes for providing macrocells, e.g., macro RAN node 1611, and one or more RAN nodes for providing femtocells or picocells (e.g., cells having smaller coverage areas, smaller user capacity, or higher bandwidth compared to macrocells), e.g., low power (LP) RAN node 1612.

Any of the RAN nodes 1611 and 1612 can terminate the air interface protocol and can be the first point of contact for the UEs 1601 and 1602. In some embodiments, any of the RAN nodes 1611 and 1612 can fulfill various logical functions for the RAN 1610 including, but not limited to, radio network controller (RNC) functions such as radio bearer management, uplink and downlink dynamic radio resource management and data packet scheduling, and mobility management.

In accordance with some embodiments, the UEs 1601 and 1602 can be configured to communicate using Orthogonal Frequency-Division Multiplexing (OFDM) communication signals with each other or with any of the RAN nodes 1611 and 1612 over a multicarrier communication channel in accordance various communication techniques, such as, but not limited to, an Orthogonal Frequency-Division Multiple Access (OFDMA) communication technique (e.g., for downlink communications) or a Single Carrier Frequency Division Multiple Access (SC-FDMA) communication technique (e.g., for uplink and ProSe or sidelink communications), although the scope of the embodiments is not limited in this respect. The OFDM signals can comprise a plurality of orthogonal subcarriers.

In some embodiments, a downlink resource grid can be used for downlink transmissions from any of the RAN nodes 1611 and 1612 to the UEs 1601 and 1602, while uplink transmissions can utilize similar techniques. The grid can be a time-frequency grid, called a resource grid or time-frequency resource grid, which is the physical resource in the downlink in each slot. Such a time-frequency plane representation is a common practice for OFDM systems, which makes it intuitive for radio resource allocation. Each column and each row of the resource grid corresponds to one OFDM symbol and one OFDM subcarrier, respectively. The duration of the resource grid in the time domain corresponds to one slot in a radio frame. The smallest time-frequency unit in a resource grid is denoted as a resource element. Each resource grid comprises a number of resource blocks, which describe the mapping of certain physical channels to resource elements. Each resource block comprises a collection of resource elements; in the frequency domain, this may represent the smallest quantity of resources that currently can be allocated. There are several different physical downlink channels that are conveyed using such resource blocks.

The physical downlink shared channel (PDSCH) may carry user data and higher-layer signaling to the UEs 1601 and 1602. The physical downlink control channel (PDCCH) may carry information about the transport format and resource allocations related to the PDSCH channel, among other things. It may also inform the UEs 1601 and 1602 about the transport format, resource allocation, and H-ARQ (Hybrid Automatic Repeat Request) information related to the uplink shared channel. Typically, downlink scheduling (assigning control and shared channel resource blocks to the UE 1602 within a cell) may be performed at any of the RAN nodes 1611 and 1612 based on channel quality information fed back from any of the UEs 1601 and 1602. The downlink resource assignment information may be sent on the PDCCH used for (e.g., assigned to) each of the UEs 1601 and 1602.

The PDCCH may use control channel elements (CCEs) to convey the control information. Before being mapped to resource elements, the PDCCH complex-valued symbols may first be organized into quadruplets, which may then be permuted using a sub-block interleaver for rate matching. Each PDCCH may be transmitted using one or more of these CCEs, where each CCE may correspond to nine sets of four physical resource elements known as resource element groups (REGs). Four Quadrature Phase Shift Keying (QPSK) symbols may be mapped to each REG. The PDCCH can be transmitted using one or more CCEs, depending on the size of the downlink control information (DCI) and the channel condition. There can be four or more different PDCCH formats defined in LTE with different numbers of CCEs (e.g., aggregation level, L=1, 2, 4, or 8).

Some embodiments may use concepts for resource allocation for control channel information that are an extension of the above-described concepts. For example, some embodiments may utilize an enhanced physical downlink control channel (EPDCCH) that uses PDSCH resources for control information transmission. The EPDCCH may be transmitted using one or more enhanced the control channel elements (ECCEs). Similar to above, each ECCE may correspond to nine sets of four physical resource elements known as enhanced resource element groups (EREGs). An ECCE may have other numbers of EREGs in some situations.

The RAN 1610 is shown to be communicatively coupled to a core network (CN) 1620—via an S1 interface 1613. In embodiments, the CN 1620 may be an evolved packet core (EPC) network, a NextGen Packet Core (NPC) network, or some other type of CN. In this embodiment the S1 interface 1613 is split into two parts: the S1-U interface 1614, which carries traffic data between the RAN nodes 1611 and 1612 and a serving gateway (S-GW) 1622, and an S1-mobility management entity (MME) interface 1615, which is a signaling interface between the RAN nodes 1611 and 1612 and MMEs 1621.

In this embodiment, the CN 1620 comprises the MMEs 1621, the S-GW 1622, a Packet Data Network (PDN) Gateway (P-GW) 1623, and a home subscriber server (HSS) 1624. The MMEs 1621 may be similar in function to the control plane of legacy Serving General Packet Radio Service (GPRS) Support Nodes (SGSN). The MMEs 1621 may manage mobility aspects in access such as gateway selection and tracking area list management. The HSS 1624 may comprise a database for network users, including subscription-related information to support the network entities' handling of communication sessions. The CN 1620 may comprise one or several HSSs 1624, depending on the number of mobile subscribers, on the capacity of the equipment, on the organization of the network, etc. For example, the HSS 1624 can provide support for routing/roaming, authentication, authorization, naming/addressing resolution, location dependencies, etc.

The S-GW 1622 may terminate the S1 interface 1613 towards the RAN 1610, and routes data packets between the RAN 1610 and the CN 1620. In addition, the S-GW 1622 may be a local mobility anchor point for inter-RAN node handovers and also may provide an anchor for inter-3GPP mobility. Other responsibilities may include lawful intercept, charging, and some policy enforcement.

The P-GW 1623 may terminate an SGi interface toward a PDN. The P-GW 1623 may route data packets between the CN 1620 (e.g., an EPC network) and external networks such as a network including the application server 1630 (alternatively referred to as application function (AF)) via an Internet Protocol (IP) interface 1625. Generally, an application server 1630 may be an element offering applications that use IP bearer resources with the core network (e.g., UMTS Packet Services (PS) domain, LTE PS data services, etc.). In this embodiment, the P-GW 1623 is shown to be communicatively coupled to an application server 1630 via an IP communications interface 1625. The application server 1630 can also be configured to support one or more communication services (e.g., Voice-over-Internet Protocol (VoIP) sessions, PTT sessions, group communication sessions, social networking services, etc.) for the UEs 1601 and 1602 via the CN 1620.

The P-GW 1623 may further be a node for policy enforcement and charging data collection. A Policy and Charging Enforcement Function (PCRF) 1626 is the policy and charging control element of the CN 1620. In a non-roaming scenario, there may be a single PCRF in the Home Public Land Mobile Network (HPLMN) associated with a UE's Internet Protocol Connectivity Access Network (IP-CAN) session. In a roaming scenario with local breakout of traffic, there may be two PCRFs associated with a UE's IP-CAN session: a Home PCRF (H-PCRF) within a HPLMN and a Visited PCRF (V-PCRF) within a Visited Public Land Mobile Network (VPLMN). The PCRF 1626 may be communicatively coupled to the application server 1630 via the P-GW 1623. The application server 1630 may signal the PCRF 1626 to indicate a new service flow and select the appropriate Quality of Service (QoS) and charging parameters. The PCRF 1626 may provision this rule into a Policy and Charging Enforcement Function (PCEF) (not shown) with the appropriate traffic flow template (TFT) and QoS class of identifier (QCI), which commences the QoS and charging as specified by the application server 1630.

Figure 17:
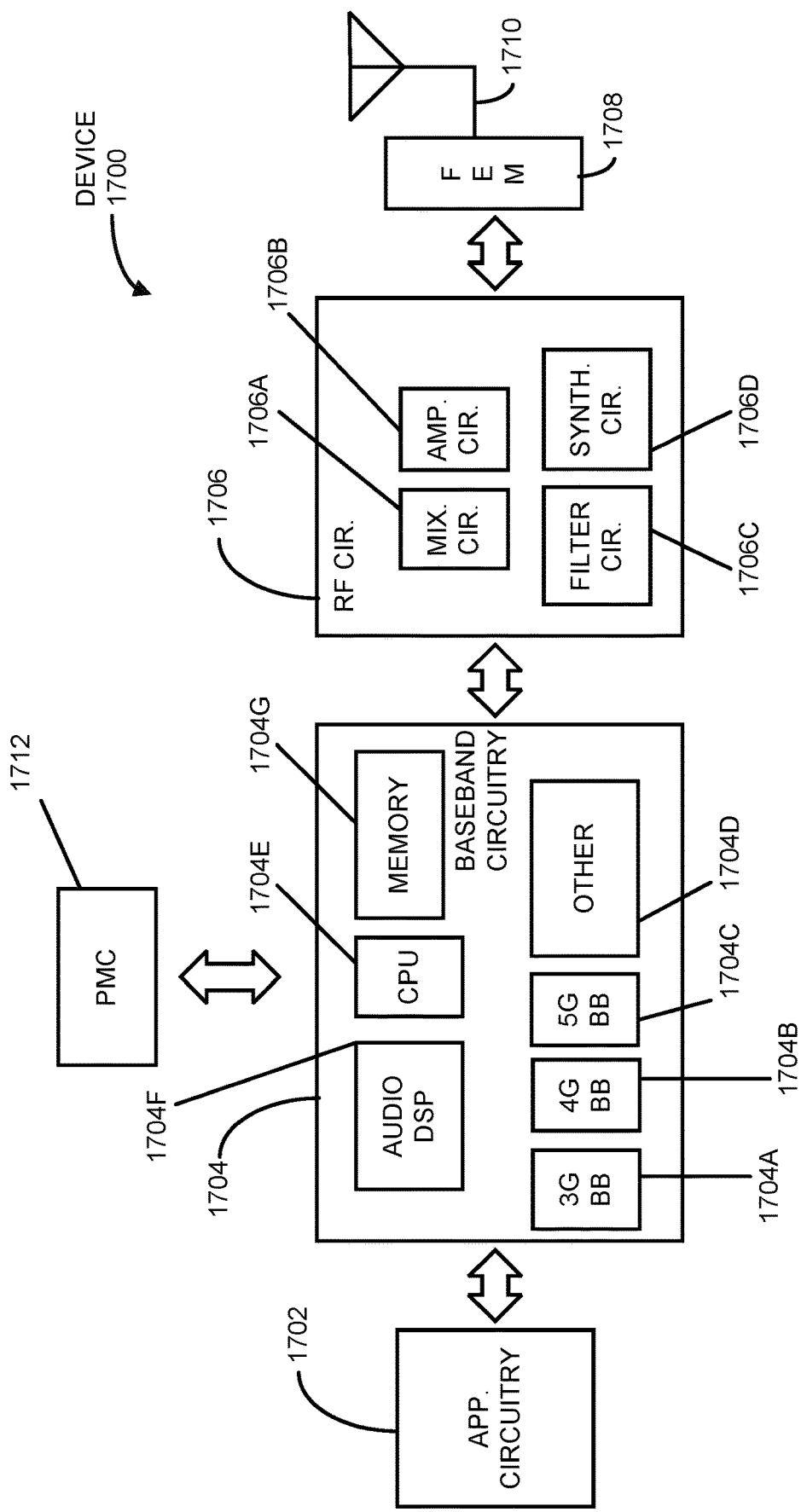
FIG. 17 illustrates example components of a device consistent with embodiments disclosed herein.

FIG. 17 illustrates example components of a device 1700 in accordance with some embodiments. In some embodiments, the device 1700 may include application circuitry 1702, baseband circuitry 1704, Radio Frequency (RF) circuitry 1706, front-end module (FEM) circuitry 1708, one or more antennas 1710, and power management circuitry (PMC) 1712 coupled together at least as shown. The components of the illustrated device 1700 may be included in a UE or a RAN node. In some embodiments, the device 1700 may include fewer elements (e.g., a RAN node may not utilize application circuitry 1702, and instead include a processor/controller to process IP data received from an EPC). In some embodiments, the device 1700 may include additional elements such as, for example, memory/storage, display, camera, sensor, or input/output (I/O) interface. In other embodiments, the components described below may be included in more than one device (e.g., said circuitries may be separately included in more than one device for Cloud-RAN (C-RAN) implementations).

The application circuitry 1702 may include one or more application processors. For example, the application circuitry 1702 may include circuitry such as, but not limited to, one or more single-core or multi-core processors. The processor(s) may include any combination of general-purpose processors and dedicated processors (e.g., graphics processors, application processors, etc.). The processors may be coupled with or may include memory/storage and may be configured to execute instructions stored in the memory/storage to enable various applications or operating systems to run on the device 1700. In some embodiments, processors of application circuitry 1702 may process IP data packets received from an EPC.

The baseband circuitry 1704 may include circuitry such as, but not limited to, one or more single-core or multi-core processors. The baseband circuitry 1704 may include one or more baseband processors or control logic to process baseband signals received from a receive signal path of the RF circuitry 1706 and to generate baseband signals for a transmit signal path of the RF circuitry 1706. Baseband processing circuitry 1704 may interface with the application circuitry 1702 for generation and processing of the baseband signals and for controlling operations of the RF circuitry 1706. For example, in some embodiments, the baseband circuitry 1704 may include a third generation (3G) baseband processor 1704A, a fourth generation (4G) baseband processor 1704B, a fifth generation (5G) baseband processor 1704C, or other baseband processor(s) 1704D for other existing generations, generations in development or to be developed in the future (e.g., second generation (2G), sixth generation (6G), etc.). The baseband circuitry 1704 (e.g., one or more of baseband processors 1704A-D) may handle various radio control functions that enable communication with one or more radio networks via the RF circuitry 1706. In other embodiments, some or all of the functionality of baseband processors 1704A-D may be included in modules stored in the memory 1704G and executed via a Central Processing Unit (CPU) 1704E. The radio control functions may include, but are not limited to, signal modulation/demodulation, encoding/decoding, radio frequency shifting, etc. In some embodiments, modulation/demodulation circuitry of the baseband circuitry 1704 may include Fast-Fourier Transform (FFT), precoding, or constellation mapping/demapping functionality. In some embodiments, encoding/decoding circuitry of the baseband circuitry 1704 may include convolution, tail-biting convolution, turbo, Viterbi, or Low Density Parity Check (LDPC) encoder/decoder functionality. Embodiments of modulation/demodulation and encoder/decoder functionality are not limited to these examples and may include other suitable functionality in other embodiments.

In some embodiments, the baseband circuitry 1704 may include one or more audio digital signal processor(s) (DSP) 1704F. The audio DSP(s) 1704F may be include elements for compression/decompression and echo cancellation and may include other suitable processing elements in other embodiments. Components of the baseband circuitry may be suitably combined in a single chip, a single chipset, or disposed on a same circuit board in some embodiments. In some embodiments, some or all of the constituent components of the baseband circuitry 1704 and the application circuitry 1702 may be implemented together such as, for example, on a system on a chip (SOC).

In some embodiments, the baseband circuitry 1704 may provide for communication compatible with one or more radio technologies. For example, in some embodiments, the baseband circuitry 1704 may support communication with an evolved universal terrestrial radio access network (EUTRAN) or other wireless metropolitan area networks (WMAN), a wireless local area network (WLAN), or a wireless personal area network (WPAN). Embodiments in which the baseband circuitry 1704 is configured to support radio communications of more than one wireless protocol may be referred to as multi-mode baseband circuitry.

RF circuitry 1706 may enable communication with wireless networks using modulated electromagnetic radiation through a non-solid medium. In various embodiments, the RF circuitry 1706 may include switches, filters, amplifiers, etc. to facilitate the communication with the wireless network. The RF circuitry 1706 may include a receive signal path which may include circuitry to down-convert RF signals received from the FEM circuitry 1708 and provide baseband signals to the baseband circuitry 1704. RF circuitry 1706 may also include a transmit signal path which may include circuitry to up-convert baseband signals provided by the baseband circuitry 1704 and provide RF output signals to the FEM circuitry 1708 for transmission.

In some embodiments, the receive signal path of the RF circuitry 1706 may include mixer circuitry 1706A, amplifier circuitry 1706B and filter circuitry 1706C. In some embodiments, the transmit signal path of the RF circuitry 1706 may include filter circuitry 1706C and mixer circuitry 1706A. RF circuitry 1706 may also include synthesizer circuitry 1706D for synthesizing a frequency for use by the mixer circuitry 1706A of the receive signal path and the transmit signal path. In some embodiments, the mixer circuitry 1706A of the receive signal path may be configured to down-convert RF signals received from the FEM circuitry 1708 based on the synthesized frequency provided by synthesizer circuitry 1706D. The amplifier circuitry 1706B may be configured to amplify the down-converted signals and the filter circuitry 1706C may be a low-pass filter (LPF) or band-pass filter (BPF) configured to remove unwanted signals from the down-converted signals to generate output baseband signals. Output baseband signals may be provided to the baseband circuitry 1704 for further processing. In some embodiments, the output baseband signals may be zero-frequency baseband signals, although this is not a requirement. In some embodiments, the mixer circuitry 1706A of the receive signal path may comprise passive mixers, although the scope of the embodiments is not limited in this respect.

In some embodiments, the mixer circuitry 1706A of the transmit signal path may be configured to up-convert input baseband signals based on the synthesized frequency provided by the synthesizer circuitry 1706D to generate RF output signals for the FEM circuitry 1708. The baseband signals may be provided by the baseband circuitry 1704 and may be filtered by the filter circuitry 1706C.

In some embodiments, the mixer circuitry 1706A of the receive signal path and the mixer circuitry 1706A of the transmit signal path may include two or more mixers and may be arranged for quadrature downconversion and upconversion, respectively. In some embodiments, the mixer circuitry 1706A of the receive signal path and the mixer circuitry 1706A of the transmit signal path may include two or more mixers and may be arranged for image rejection (e.g., Hartley image rejection). In some embodiments, the mixer circuitry 1706A of the receive signal path and the mixer circuitry 1706A may be arranged for direct downconversion and direct upconversion, respectively. In some embodiments, the mixer circuitry 1706A of the receive signal path and the mixer circuitry 1706A of the transmit signal path may be configured for super-heterodyne operation.

In some embodiments, the output baseband signals and the input baseband signals may be analog baseband signals, although the scope of the embodiments is not limited in this respect. In some alternate embodiments, the output baseband signals and the input baseband signals may be digital baseband signals. In these alternate embodiments, the RF circuitry 1706 may include analog-to-digital converter (ADC) and digital-to-analog converter (DAC) circuitry and the baseband circuitry 1704 may include a digital baseband interface to communicate with the RF circuitry 1706.

In some dual-mode embodiments, a separate radio IC circuitry may be provided for processing signals for each spectrum, although the scope of the embodiments is not limited in this respect.

In some embodiments, the synthesizer circuitry 1706D may be a fractional-N synthesizer or a fractional N/N+1 synthesizer, although the scope of the embodiments is not limited in this respect as other types of frequency synthesizers may be suitable. For example, synthesizer circuitry 1706D may be a delta-sigma synthesizer, a frequency multiplier, or a synthesizer comprising a phase-locked loop with a frequency divider.

The synthesizer circuitry 1706D may be configured to synthesize an output frequency for use by the mixer circuitry 1706A of the RF circuitry 1706 based on a frequency input and a divider control input. In some embodiments, the synthesizer circuitry 1706D may be a fractional N/N+1 synthesizer.

In some embodiments, frequency input may be provided by a voltage controlled oscillator (VCO), although that is not a requirement. Divider control input may be provided by either the baseband circuitry 1704 or the application circuitry 1702 (such as an applications processor) depending on the desired output frequency. In some embodiments, a divider control input (e.g., N) may be determined from a look-up table based on a channel indicated by the application circuitry 1702.

Synthesizer circuitry 1706D of the RF circuitry 1706 may include a divider, a delay-locked loop (DLL), a multiplexer and a phase accumulator. In some embodiments, the divider may be a dual modulus divider (DMD) and the phase accumulator may be a digital phase accumulator (DPA). In some embodiments, the DMD may be configured to divide the input signal by either N or N+1 (e.g., based on a carry out) to provide a fractional division ratio. In some example embodiments, the DLL may include a set of cascaded, tunable, delay elements, a phase detector, a charge pump and a D-type flip-flop. In these embodiments, the delay elements may be configured to break a VCO period up into Nd equal packets of phase, where Nd is the number of delay elements in the delay line. In this way, the DLL provides negative feedback to help ensure that the total delay through the delay line is one VCO cycle.

In some embodiments, the synthesizer circuitry 1706D may be configured to generate a carrier frequency as the output frequency, while in other embodiments, the output frequency may be a multiple of the carrier frequency (e.g., twice the carrier frequency, four times the carrier frequency) and used in conjunction with quadrature generator and divider circuitry to generate multiple signals at the carrier frequency with multiple different phases with respect to each other. In some embodiments, the output frequency may be a LO frequency (fLO). In some embodiments, the RF circuitry 1706 may include an IQ/polar converter.

FEM circuitry 1708 may include a receive signal path which may include circuitry configured to operate on RF signals received from one or more antennas 1710, amplify the received signals and provide the amplified versions of the received signals to the RF circuitry 1706 for further processing. The FEM circuitry 1708 may also include a transmit signal path which may include circuitry configured to amplify signals for transmission provided by the RF circuitry 1706 for transmission by one or more of the one or more antennas 1710. In various embodiments, the amplification through the transmit or receive signal paths may be done solely in the RF circuitry 1706, solely in the FEM circuitry 1708, or in both the RF circuitry 1706 and the FEM circuitry 1708.

In some embodiments, the FEM circuitry 1708 may include a TX/RX switch to switch between transmit mode and receive mode operation. The FEM circuitry 1708 may include a receive signal path and a transmit signal path. The receive signal path of the FEM circuitry 1708 may include an LNA to amplify received RF signals and provide the amplified received RF signals as an output (e.g., to the RF circuitry 1706). The transmit signal path of the FEM circuitry 1708 may include a power amplifier (PA) to amplify input RF signals (e.g., provided by the RF circuitry 1706), and one or more filters to generate RF signals for subsequent transmission (e.g., by one or more of the one or more antennas 1710).

In some embodiments, the PMC 1712 may manage power provided to the baseband circuitry 1704. In particular, the PMC 1712 may control power-source selection, voltage scaling, battery charging, or DC-to-DC conversion. The PMC 1712 may often be included when the device 1700 is capable of being powered by a battery, for example, when the device 1700 is included in a UE. The PMC 1712 may increase the power conversion efficiency while providing desirable implementation size and heat dissipation characteristics.

FIG. 17 shows the PMC 1712 coupled only with the baseband circuitry 1704. However, in other embodiments, the PMC 1712 may be additionally or alternatively coupled with, and perform similar power management operations for, other components such as, but not limited to, the application circuitry 1702, the RF circuitry 1706, or the FEM circuitry 1708.

In some embodiments, the PMC 1712 may control, or otherwise be part of, various power saving mechanisms of the device 1700. For example, if the device 1700 is in an RRC_Connected state, where it is still connected to the RAN node as it expects to receive traffic shortly, then it may enter a state known as Discontinuous Reception Mode (DRX) after a period of inactivity. During this state, the device 1700 may power down for brief intervals of time and thus save power.

If there is no data traffic activity for an extended period of time, then the device 1700 may transition off to an RRC_Idle state, where it disconnects from the network and does not perform operations such as channel quality feedback, handover, etc. The device 1700 goes into a very low power state and it performs paging where again it periodically wakes up to listen to the network and then powers down again. The device 1700 may not receive data in this state, and in order to receive data, it transitions back to an RRC_Connected state.

An additional power saving mode may allow a device to be unavailable to the network for periods longer than a paging interval (ranging from seconds to a few hours). During this time, the device is totally unreachable to the network and may power down completely. Any data sent during this time incurs a large delay and it is assumed the delay is acceptable.

Processors of the application circuitry 1702 and processors of the baseband circuitry 1704 may be used to execute elements of one or more instances of a protocol stack. For example, processors of the baseband circuitry 1704, alone or in combination, may be used to execute Layer 3, Layer 2, or Layer 1 functionality, while processors of the application circuitry 1702 may utilize data (e.g., packet data) received from these layers and further execute Layer 4 functionality (e.g., transmission communication protocol (TCP) and user datagram protocol (UDP) layers). As referred to herein, Layer 3 may comprise a radio resource control (RRC) layer, described in further detail below. As referred to herein, Layer 2 may comprise a medium access control (MAC) layer, a radio link control (RLC) layer, and a packet data convergence protocol (PDCP) layer, described in further detail below. As referred to herein, Layer 1 may comprise a physical (PHY) layer of a UE/RAN node, described in further detail below.

Figure 18:
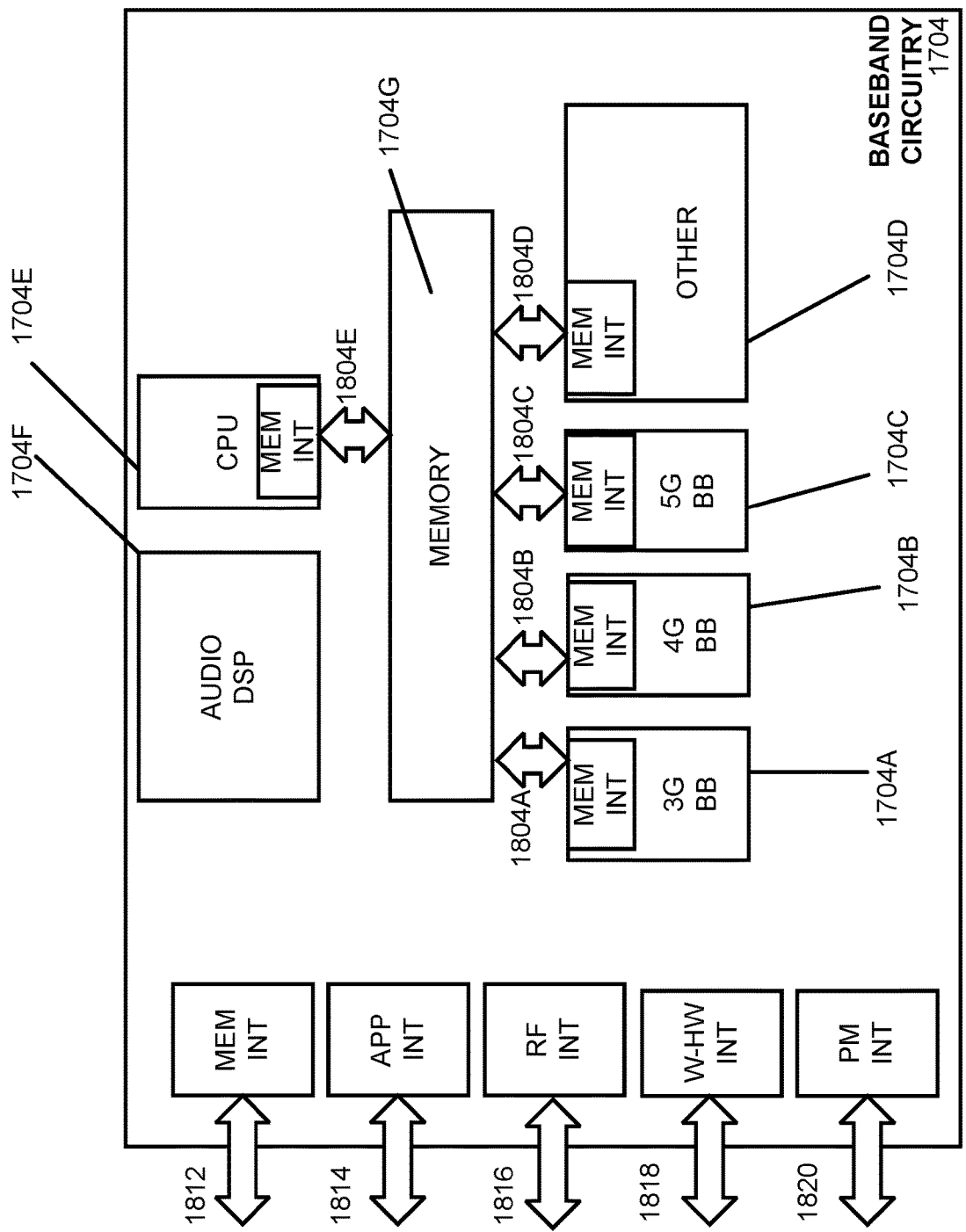
FIG. 18 illustrates example interfaces of baseband circuitry consistent with embodiments disclosed herein.

FIG. 18 illustrates example interfaces of baseband circuitry in accordance with some embodiments. As discussed above, the baseband circuitry 1704 of FIG. 17 may comprise processors 1704A-1704E and a memory 1704G utilized by said processors. Each of the processors 1704A-1704E may include a memory interface, 1804A-1804E, respectively, to send/receive data to/from the memory 1704G.

The baseband circuitry 1704 may further include one or more interfaces to communicatively couple to other circuitries/devices, such as a memory interface 1812 (e.g., an interface to send/receive data to/from memory external to the baseband circuitry 1704), an application circuitry interface 1814 (e.g., an interface to send/receive data to/from the application circuitry 1702 of FIG. 17), an RF circuitry interface 1816 (e.g., an interface to send/receive data to/from RF circuitry 1706 of FIG. 17), a wireless hardware connectivity interface 1818 (e.g., an interface to send/receive data to/from Near Field Communication (NFC) components, Bluetooth® components (e.g., Bluetooth® Low Energy), Wi-Fi® components, and other communication components), and a power management interface 1820 (e.g., an interface to send/receive power or control signals to/from the PMC 1712.

Figure 19:
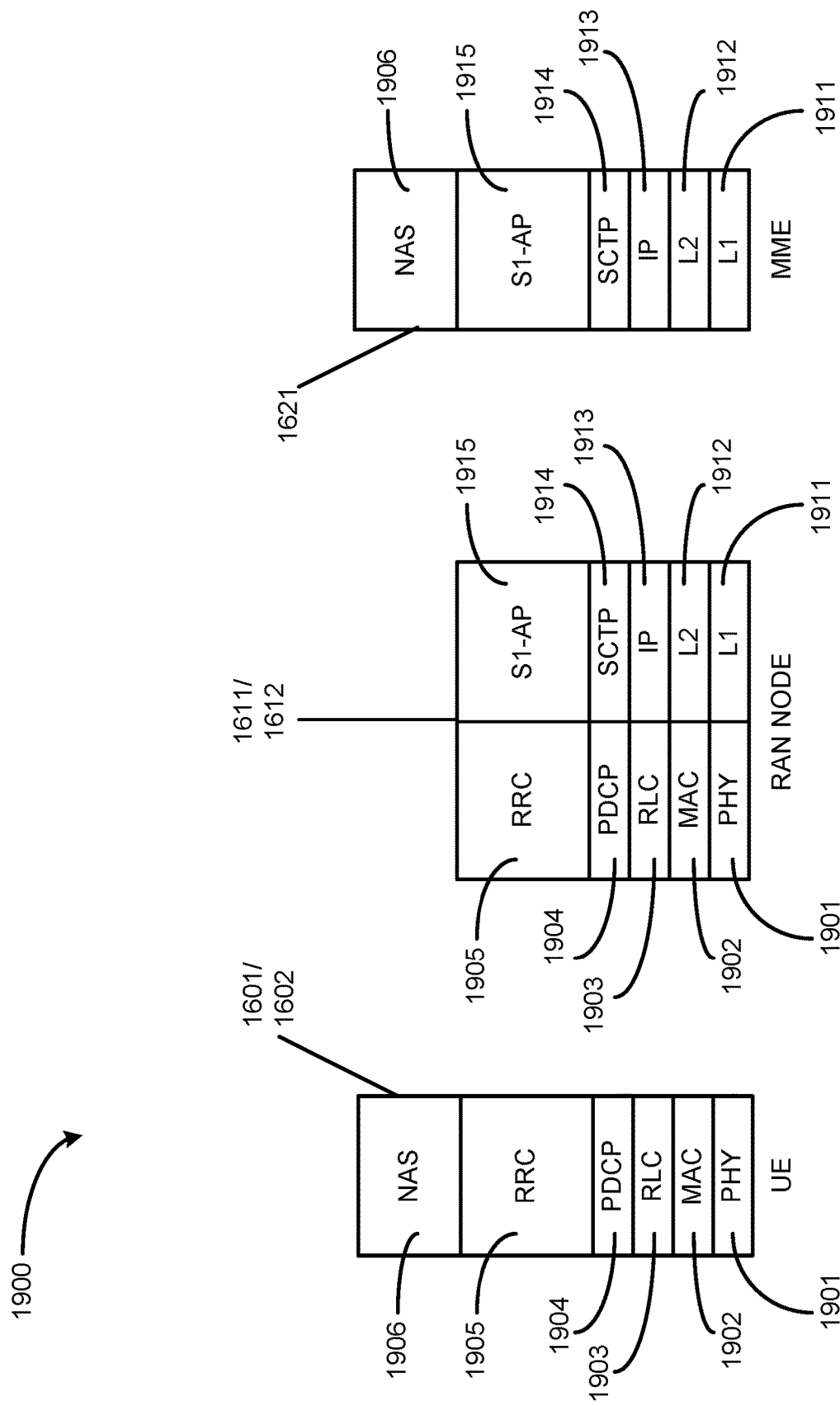
FIG. 19 is an illustration of a control plane protocol stack consistent with embodiments disclosed herein.

FIG. 19 is an illustration of a control plane protocol stack in accordance with some embodiments. In this embodiment, a control plane 1900 is shown as a communications protocol stack between the UE 1601 (or alternatively, the UE 1602), the RAN node 1611 (or alternatively, the RAN node 1612), and the MME 1621.

A PHY layer 1901 may transmit or receive information used by the MAC layer 1902 over one or more air interfaces. The PHY layer 1901 may further perform link adaptation or adaptive modulation and coding (AMC), power control, cell search (e.g., for initial synchronization and handover purposes), and other measurements used by higher layers, such as an RRC layer 1905. The PHY layer 1901 may still further perform error detection on the transport channels, forward error correction (FEC) coding/decoding of the transport channels, modulation/demodulation of physical channels, interleaving, rate matching, mapping onto physical channels, and Multiple Input Multiple Output (MIMO) antenna processing.

The MAC layer 1902 may perform mapping between logical channels and transport channels, multiplexing of MAC service data units (SDUs) from one or more logical channels onto transport blocks (TB) to be delivered to PHY via transport channels, de-multiplexing MAC SDUs to one or more logical channels from transport blocks (TB) delivered from the PHY via transport channels, multiplexing MAC SDUs onto TBs, scheduling information reporting, error correction through hybrid automatic repeat request (HARQ), and logical channel prioritization.

An RLC layer 1903 may operate in a plurality of modes of operation, including: Transparent Mode (TM), Unacknowledged Mode (UM), and Acknowledged Mode (AM). The RLC layer 1903 may execute transfer of upper layer protocol data units (PDUs), error correction through automatic repeat request (ARQ) for AM data transfers, and concatenation, segmentation and reassembly of RLC SDUs for UM and AM data transfers. The RLC layer 1903 may also execute re-segmentation of RLC data PDUs for AM data transfers, reorder RLC data PDUs for UM and AM data transfers, detect duplicate data for UM and AM data transfers, discard RLC SDUs for UM and AM data transfers, detect protocol errors for AM data transfers, and perform RLC re-establishment.

A PDCP layer 1904 may execute header compression and decompression of IP data, maintain PDCP Sequence Numbers (SNs), perform in-sequence delivery of upper layer PDUs at re-establishment of lower layers, eliminate duplicates of lower layer SDUs at re-establishment of lower layers for radio bearers mapped on RLC AM, cipher and decipher control plane data, perform integrity protection and integrity verification of control plane data, control timer-based discard of data, and perform security operations (e.g., ciphering, deciphering, integrity protection, integrity verification, etc.).

The main services and functions of the RRC layer 1905 may include broadcast of system information (e.g., included in Master Information Blocks (MIBs) or System Information Blocks (SIBs) related to the non-access stratum (NAS)), broadcast of system information related to the access stratum (AS), paging, establishment, maintenance and release of an RRC connection between the UE and E-UTRAN (e.g., RRC connection paging, RRC connection establishment, RRC connection modification, and RRC connection release), establishment, configuration, maintenance and release of point-to-point radio bearers, security functions including key management, inter radio access technology (RAT) mobility, and measurement configuration for UE measurement reporting. Said MIBs and SIBs may comprise one or more information elements (IEs), which may each comprise individual data fields or data structures.

The UE 1601 and the RAN node 1611 may utilize a Uu interface (e.g., an LTE-Uu interface) to exchange control plane data via a protocol stack comprising the PHY layer 1901, the MAC layer 1902, the RLC layer 1903, the PDCP layer 1904, and the RRC layer 1905.

In the embodiment shown, the non-access stratum (NAS) protocols 1906 form the highest stratum of the control plane between the UE 1601 and the MME 1621. The NAS protocols 1906 support the mobility of the UE 1601 and the session management procedures to establish and maintain IP connectivity between the UE 1601 and the P-GW 1623.

The S1 Application Protocol (S1-AP) layer 1915 may support the functions of the S1 interface and comprise Elementary Procedures (EPs). An EP is a unit of interaction between the RAN node 1611 and the CN 1620. The S1-AP layer services may comprise two groups: UE-associated services and non UE-associated services. These services perform functions including, but not limited to: E-UTRAN Radio Access Bearer (E-RAB) management, UE capability indication, mobility, NAS signaling transport, RAN Information Management (RIM), and configuration transfer.

The Stream Control Transmission Protocol (SCTP) layer (alternatively referred to as the stream control transmission protocol/internet protocol (SCTP/IP) layer) 1914 may ensure reliable delivery of signaling messages between the RAN node 1611 and the MME 1621 based, in part, on the IP protocol, supported by an IP layer 1913. An L2 layer 1912 and an L1 layer 1911 may refer to communication links (e.g., wired or wireless) used by the RAN node and the MME to exchange information.

The RAN node 1611 and the MME 1621 may utilize an S1-MME interface to exchange control plane data via a protocol stack comprising the L1 layer 1911, the L2 layer 1912, the IP layer 1913, the SCTP layer 1914, and the S1-AP layer 1915.

Figure 20:
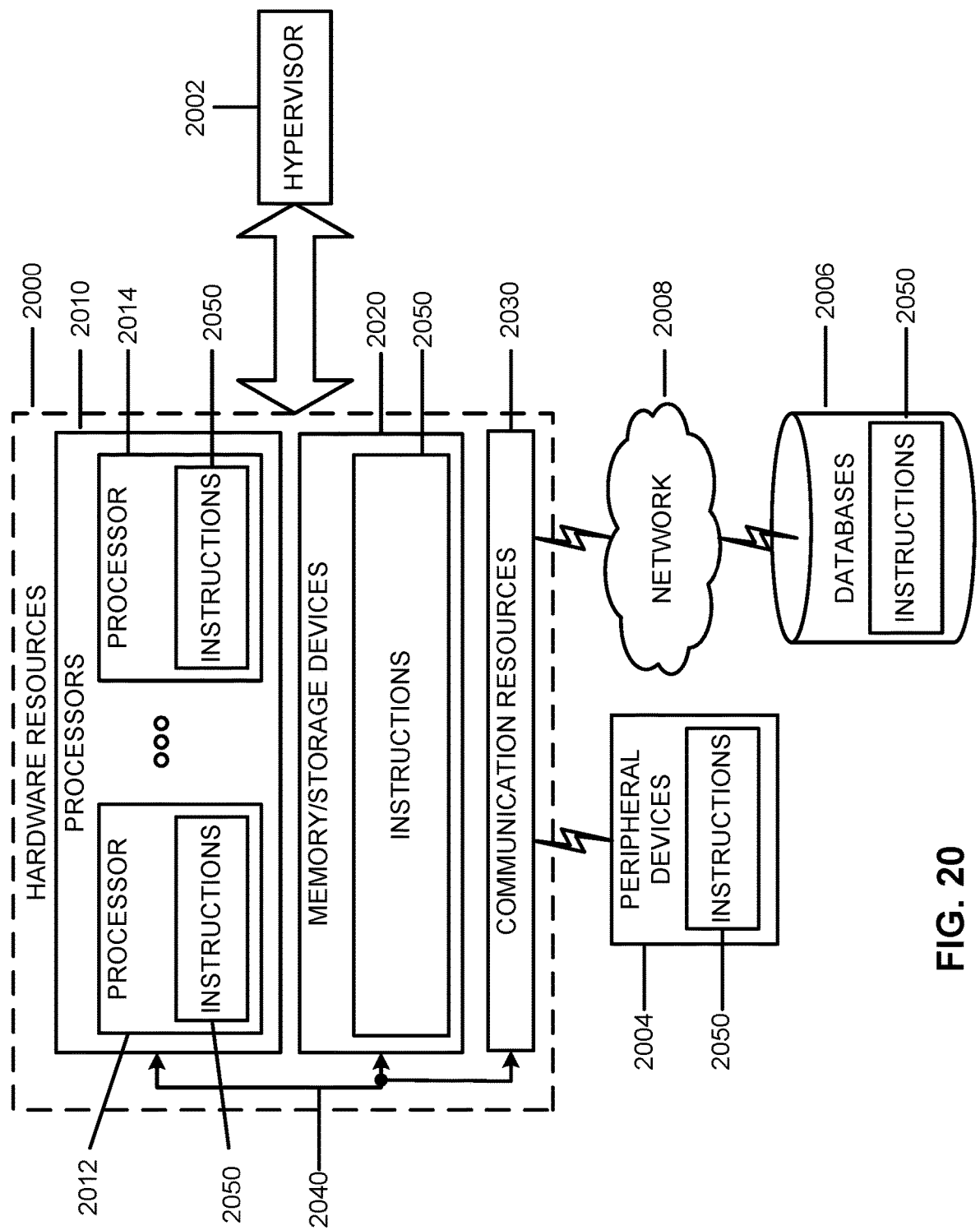
FIG. 20 is a block diagram illustrating components able to read instructions from a machine-readable or computer-readable medium and perform any one or more of the methodologies discussed herein.

FIG. 20 is a block diagram illustrating components, according to some example embodiments, able to read instructions from a machine-readable or computer-readable medium (e.g., a non-transitory machine-readable storage medium) and perform any one or more of the methodologies discussed herein. Specifically, FIG. 20 shows a diagrammatic representation of hardware resources 2000 including one or more processors (or processor cores) 2010, one or more memory/storage devices 2020, and one or more communication resources 2030, each of which may be communicatively coupled via a bus 2040. For embodiments where node virtualization (e.g., NFV) is utilized, a hypervisor 2002 may be executed to provide an execution environment for one or more network slices/sub-slices to utilize the hardware resources 2000.

The processors 2010 (e.g., a central processing unit (CPU), a reduced instruction set computing (RISC) processor, a complex instruction set computing (CISC) processor, a graphics processing unit (GPU), a digital signal processor (DSP) such as a baseband processor, an application specific integrated circuit (ASIC), a radio-frequency integrated circuit (RFIC), another processor, or any suitable combination thereof) may include, for example, a processor 2012 and a processor 2014.

The memory/storage devices 2020 may include main memory, disk storage, or any suitable combination thereof. The memory/storage devices 2020 may include, but are not limited to any type of volatile or non-volatile memory such as dynamic random access memory (DRAM), static random-access memory (SRAM), erasable programmable read-only memory (EPROM), electrically erasable programmable read-only memory (EEPROM), Flash memory, solid-state storage, etc.

The communication resources 2030 may include interconnection or network interface components or other suitable devices to communicate with one or more peripheral devices 2004 or one or more databases 2006 via a network 2008. For example, the communication resources 2030 may include wired communication components (e.g., for coupling via a Universal Serial Bus (USB)), cellular communication components, NFC components, Bluetooth® components (e.g., Bluetooth® Low Energy), Wi-Fi® components, and other communication components.

Instructions 2050 may comprise software, a program, an application, an applet, an app, or other executable code for causing at least any of the processors 2010 to perform any one or more of the methodologies discussed herein. The instructions 2050 may reside, completely or partially, within at least one of the processors 2010 (e.g., within the processor's cache memory), the memory/storage devices 2020, or any suitable combination thereof. Furthermore, any portion of the instructions 2050 may be transferred to the hardware resources 2000 from any combination of the peripheral devices 2004 or the databases 2006. Accordingly, the memory of processors 2010, the memory/storage devices 2020, the peripheral devices 2004, and the databases 2006 are examples of computer-readable and machine-readable media.

EXAMPLES

The following examples pertain to further embodiments.

Example 1 is an apparatus for a radio access network (RAN) node, comprising a transmitter interface and a processor. The transmitter interface is configured to provide a set of orthogonal frequency-division multiplex (OFDM) symbols to a transmitter for transmission to a user equipment (UE). The processor is configured to: segment a bit sequence into blocks; encode the blocks to form codeblocks; group the codeblocks into a codeblock group, the codeblock group selected to fit an integer number of codeblocks within an OFDM symbol group, the OFDM symbol group including an integer number of OFDM symbols; encode the codeblock group to form the OFDM symbol group; and provide the OFDM symbol group to the transmitter using the transmitter interface.

Example 2 is the apparatus of Example 1, wherein the processor is further configured to receive the bit sequence from an application.

Example 3 is the apparatus of Example 1, wherein the processor is further configured to compute a cyclic redundancy checksum (CRC) for the codeblock group and append the CRC to the codeblock group for encoding to form the OFDM symbol group.

Example 4 is the apparatus of Example 1, wherein the processor is further configured to segment data that includes the bit sequence, a segment size based at least in part on available resource elements for a set of codeblock groups, code-rate and modulation order of a transmission including the OFDM symbol group.

Example 5 is the apparatus of Example 4, wherein the segment size of a codeblock and the available resource elements for the codeblock have an approximately linear relationship.

Example 6 is the apparatus of any of Examples 1-3, wherein the processor is further configured to append padding bits or modulated symbols to normalize an effective code rate of the codeblock group with other codeblock groups within a transport block.

Example 7 is the apparatus of any of Examples 1-3, wherein the processor is a baseband processor.

Example 8 is an apparatus for a user equipment (UE), comprising a receiver interface and a processor. The receiver interface is configured to provide a set of orthogonal frequency-division multiplex (OFDM) symbols from a receiver from a radio access network (RAN) node. The processor is configured to: receive an OFDM symbol group from the receiver interface; decode a set of codeblocks forming a codeblock group, the codeblock group selected to fit an integer number of codeblocks within an OFDM symbol group, the OFDM symbol group including an integer number of OFDM symbols, wherein the OFDM symbol group boundary matches the codeblock group boundary; and provide a response to the RAN node within a turnaround time acknowledging a receipt of the data from the OFDM symbol group.

Example 9 is the apparatus of Example 1, wherein the processor is further configured to receive the bit sequence from an application.

Example 10 is the apparatus of Example 1, wherein the processor is further configured to compute a first cyclic redundancy checksum (CRC) for the codeblock group and compare the first CRC to a second CRC appended to the codeblock group.

Example 11 is the apparatus of any of Examples 10, wherein the response is an acknowledgement based at least in part on the first CRC matching the second CRC.

Example 12 is the apparatus of any of Examples 1-3, wherein the processor is a baseband processor.

Example 13 is a method of pipelined processing of received data to enable a response to a radio access network (RAN) node within a turnaround time. The method comprising: processing, from the RAN node, a second to last orthogonal frequency-division multiplex (OFDM) symbol comprising a first number of usable resource elements, the second to last OFDM symbol having a first decoding time; processing a last OFDM symbol comprising a second number of usable resource elements, the last OFDM symbol having a second decoding time, the first number of resource elements greater than the second number of resource elements and the first decoding time more than the second decoding time; decoding the second to last OFDM symbol and the a last OFDM symbol with enough remaining time to prepare the response to the RAN node within the turnaround time; and generating the response for transmission within the turnaround time.

Example 14 is the method of Example 13, wherein the last OFDM symbol comprises the second number of usable resource elements and padding resource elements.

Example 15 is the method of Example 14, wherein the padding resource elements are non-data information bits.

Example 16 is the method of Example 14, wherein the padding resource elements are a repeated subset of usable resource elements from the last OFDM symbol.

Example 17 is the method of Example 14, wherein the repeated subset of usable resource elements are from one or more of last usable codeblocks of the last OFDM symbol.

Example 18 is the method of Example 13, further comprising providing a receiver capability indicator to the RAN node indicating a mapping between receiver processing time and supported maximum rate for the receiver processing time.

Example 19 is the method of Example 13, further comprising providing a receiver capability indicator to the RAN node indicating a mapping between maximum allowed timing advance configured for uplink transmission and supported maximum rate for timing advance.

Example 20 is the method of Example 13, further comprising providing a receiver capability indicator to the RAN node indicating a mapping bet between receiver processing time and: an average number of codeblocks per OFDM symbol of a data transmission; a number of codeblocks in a last one or more OFDM symbols of the data transmission; a rounded up maximum number of code blocks in a OFDM symbol of a data transmission; or a combination of transmit rank, modulation and coding scheme (MCS), and allocated resource elements.

Example 21 is an apparatus comprising means to perform a method as exemplified in any of Examples 13-18.

Example 22 is a machine-readable storage including machine-readable instructions, when executed, to implement a method or realize an apparatus as exemplified in any of Examples 13-18.

Example 23 is a machine readable medium including code, when executed, to cause a machine to perform the method of any one of Examples 13-18.

Example 24 is an apparatus of a user equipment (UE), comprising a receiver interface and a processor. The receiver interface is configured to receive a set of OFDM symbols from a receiver that receives transmissions from a radio access network (RAN) node. The processor is configured to: process a second to last OFDM symbol comprising a first number of usable resource elements, the second to last OFDM symbol having a first decoding time; process a last OFDM symbol comprising a second number of usable resource elements, the last OFDM symbol having a second decoding time, the first number of resource elements greater than the second number of resource elements and the first decoding time more than the second decoding time; decoding the second to last OFDM symbol and the a last OFDM symbol in time to prepare a response to the RAN node within a turnaround time; and generating the response for transmission within the turnaround time.

Example 25 is the apparatus of Example 24, wherein the last OFDM symbol comprises fewer resource elements than the second to last OFDM symbol.

Example 26 is the apparatus of Example 24, wherein the last OFDM symbol comprises padding bits after encoded information bits.

Example 27 is the apparatus of Example 24, wherein the last OFDM symbol comprises duplicate bits after encoded information bits.

Example 28 is a computer program product comprising a computer-readable storage medium that stores instructions for execution by a processor to perform operations of a radio access network (RAN) node, the operations, when executed by the processor, to perform a method. The method comprising: segmenting a bit sequence into blocks; encoding the blocks to form codeblocks; grouping the codeblocks into a codeblock group, the codeblock group selected to fit an integer number of codeblocks within an orthogonal frequency-division multiplex (OFDM) symbol group, the OFDM symbol group including an integer number of OFDM symbols; encoding the codeblock group to form the OFDM symbol group; and providing the OFDM symbol group to a transmitter for transmission to a user equipment (UE).

Example 29 is the computer program product of Example 28, wherein the method further comprises computing a cyclic redundancy checksum (CRC) for the codeblock group and append the CRC to the codeblock group for encoding to form the OFDM symbol group.

Example 30 is an apparatus for a radio access network (RAN) node. The apparatus comprising: means for segmenting a bit sequence into blocks; means for encoding the blocks to form codeblocks; means for grouping the codeblocks into a codeblock group, the codeblock group selected to fit an integer number of codeblocks within an orthogonal frequency-division multiplex (OFDM) symbol group, the OFDM symbol group including an integer number of OFDM symbols; means for encoding the codeblock group to form the OFDM symbol group; and means for providing the OFDM symbol group to a transmitter, using the transmitter interface, for transmission to a user equipment (UE).

Example 31 is the apparatus of Example 30, further comprising means for computing a cyclic redundancy checksum (CRC) for the codeblock group and append the CRC to the codeblock group for encoding to form the OFDM symbol group.

Additional Examples—Set 1

Additional Example 1 may include an apparatus comprising means to process a received data signal, means to process the received data signal to determine a receiver capability, means to determine a signal padding based on the receiver capability, and means to transmit a response based on the received data signal comprising the signal padding.

Additional Example 2 may include the apparatus according to Additional Example 1, further comprising means to apply the signal padding to a subset of orthogonal frequency-division multiplexing ("OFDM") symbols transporting data.

Additional Example 3 may include the apparatus according to Additional Example 1 or Additional Example 2 or some other Additional Example herein, wherein the means to apply the signal padding comprises means to reduce the number of resource elements for data of the subset of the OFDM symbols, wherein a resource element is a single modulated constellation symbol spanning one OFDM symbol and one subcarrier and one spatial layer.

Additional Example 4 may include the apparatus according to Additional Example 1 or Additional Example 2 or some other Additional Example herein, wherein means to transmit the response based on the received data signal comprising the signal padding comprises means to add non data information bits after encoded information bits.

Additional Example 5 may include the apparatus according to Additional Example 1 or Additional Example 2 or some other Additional Example herein, wherein means to transmit the response based on the received data signal comprising the signal padding comprises means to repeat a subset of encoded information bits.

Additional Example 6 may include the apparatus according to Additional Example 5 and/or some other Additional Example herein, wherein the subset of encoded information bits is from a last N code blocks of the encoded information bits.

Additional Example 7 may include the apparatus according to Additional Example 1 or some other Additional Example herein, further comprising means to determine the receiver capability based on a signal that informs mapping between required receiver processing time and supported maximum rate for the receiver processing time.

Additional Example 8 may include the apparatus according to Additional Example 1 or some other Additional Example herein, further comprising means to determine the receiver capability based on a signal that informs mapping between maximum allowed timing advance configured for uplink transmission and supported maximum rate for the maximum allowed timing advance.

Additional Example 9 may include the apparatus of at least one of Additional Example 7 and Additional Example 8 and/or some other Additional Example herein, wherein the supported maximum rate can be replaced with 'average number of code blocks per OFDM symbol of the data transmission'.

Additional Example 10 may include the apparatus of Additional Example 7 and/or some other Additional Example herein, wherein the supported maximum rate can be replaced with 'number of code blocks in the last 'M' OFDM symbols of the data transmission'.

Additional Example 11 may include the apparatus of Additional Example 7 and/or some other Additional Example herein, wherein the supported maximum rate can be replaced with 'rounded up maximum number of code blocks in any OFDM symbol of the data transmission'.

Additional Example 12 may include the apparatus of Additional Example 7 and/or some other Additional Example herein, wherein the supported maximum rate can be replaced with 'a combinations of transmit rank, modulation coding scheme ("MCS"), and allocated resource elements ("REs")'.

Additional Example 13 may include the apparatus of any one or more of Additional Example 1 to Additional Example 12 or some other Additional Example herein, wherein the apparatus is at least one of a user equipment ("UE") or an eNode B.

Additional Example 14 may include an apparatus comprising means to determine a receiver capability and means to transmit a signal comprising the receiver capability.

Additional Example 15 may include the apparatus of Additional Example 14 or some other Additional Example herein, wherein the means to transmit the signal comprising the receiver capability comprises means to inform mapping between required receiver processing time and supported maximum rate for the receiver processing time.

Additional Example 16 may include the apparatus of Additional Example 14 or some other Additional Example herein, wherein the means to transmit the signal comprising the receiver capability comprises means to inform mapping between maximum allowed timing advance configured for uplink transmission and supported maximum rate for the maximum allowed timing advance.

Additional Example 17 may include the apparatus of at least one of Additional Example 15 to Additional Example 16 or some other Additional Example herein, wherein the supported maximum rate can be replaced with 'average number of code blocks per orthogonal frequency-division multiplexing ("OFDM") symbol of the data transmission'.

Additional Example 18 may include the apparatus of Additional Example 15 or some other Additional Example herein, wherein the supported maximum rate can be replaced with 'number of code blocks in the last 'M' OFDM symbols of the data transmission'.

Additional Example 19 may include the apparatus of Additional Example 15 or some other Additional Example herein, wherein the supported maximum rate can be replaced with 'rounded up maximum number of code blocks in any OFDM symbol of the data transmission'.

Additional Example 20 may include the apparatus of Additional Example 15 or some other Additional Example herein, wherein the supported maximum rate can be replaced with 'a combinations of transmit rank, modulation coding scheme ("MCS"), and allocated resource elements ("REs")'.

Additional Example 21 may include the apparatus of any one or more of Additional Example 14 to Additional Example 20 or some other Additional Example herein, wherein the apparatus is at least one of a user equipment ("UE") or an eNode B.

Additional Example 22 may include an apparatus to process a received data signal, process the received data signal to determine a receiver capability, determine a signal padding based on the receiver capability, and transmit a response based on the received data signal comprising the signal padding.

Additional Example 23 may include the apparatus according to Additional Example 22, wherein the apparatus is further to apply the signal padding to a subset of orthogonal frequency-division multiplexing ("OFDM") symbols transporting data.

Additional Example 24 may include the apparatus according to Additional Example 22 or Additional Example 23 or some other Additional Example herein, wherein the apparatus is further to apply the signal padding by reducing the number of resource elements for data of the subset of the OFDM symbols, wherein a resource element is a single modulated constellation symbol spanning one OFDM symbol and one subcarrier and one spatial layer.

Additional Example 25 may include the apparatus according to Additional Example 22 or Additional Example 23 or some other Additional Example herein, wherein the apparatus is further to transmit the response based on the received data signal comprising the signal padding by adding non data information bits after encoded information bits.

Additional Example 26 may include the apparatus according to Additional Example 22 or Additional Example 23 or some other Additional Example herein, wherein the apparatus is further to transmit the response based on the received data signal comprising the signal padding by repeating a subset of encoded information bits.

Additional Example 27 may include the apparatus according to Additional Example 26 and/or some other Additional Example herein, wherein the subset of encoded information bits is from a last N code blocks of the encoded information bits.

Additional Example 28 may include the apparatus according to Additional Example 22 or some other Additional Example herein, wherein the apparatus is further to determine the receiver capability based on a signal that informs mapping between required receiver processing time and supported maximum rate for the receiver processing time.

Additional Example 29 may include the apparatus according to Additional Example 22 or some other Additional Example herein, wherein the apparatus is further to determine the receiver capability based on a signal that informs mapping between maximum allowed timing advance configured for uplink transmission and supported maximum rate for the maximum allowed timing advance.

Additional Example 30 may include the apparatus of at least one of Additional Example 28 and Additional Example 29 and/or some other Additional Example herein, wherein the supported maximum rate can be replaced with 'average number of code blocks per OFDM symbol of the data transmission'.

Additional Example 31 may include the apparatus of Additional Example 28 and/or some other Additional Example herein, wherein the supported maximum rate can be replaced with 'number of code blocks in the last 'M' OFDM symbols of the data transmission'.

Additional Example 32 may include the apparatus of Additional Example 28 and/or some other Additional Example herein, wherein the supported maximum rate can be replaced with 'rounded up maximum number of code blocks in any OFDM symbol of the data transmission'.

Additional Example 33 may include the apparatus of Additional Example 28 and/or some other Additional Example herein, wherein the supported maximum rate can be replaced with 'a combinations of transmit rank, modulation coding scheme ("MCS"), and allocated resource elements ("REs").

Additional Example 34 may include the apparatus of any one or more of Additional Example 22 to Additional Example 33 or some other Additional Example herein, wherein the apparatus is at least one of a user equipment ("UE") or an eNode B.

Additional Example 35 may include an apparatus to determine a receiver capability and transmit a signal comprising the receiver capability.

Additional Example 36 may include the apparatus of Additional Example 35 or some other Additional Example herein, wherein to transmit the signal comprising the receiver capability comprises to inform mapping between required receiver processing time and supported maximum rate for the receiver processing time.

Additional Example 37 may include the apparatus of Additional Example 35 or some other Additional Example herein, wherein to transmit the signal comprising the receiver capability comprises to inform mapping between maximum allowed timing advance configured for uplink transmission and supported maximum rate for the maximum allowed timing advance.

Additional Example 38 may include the apparatus of at least one of Additional Example 36 to Additional Example 37 or some other Additional Example herein, wherein the supported maximum rate can be replaced with 'average number of code blocks per orthogonal frequency-division multiplexing ("OFDM") symbol of the data transmission'.

Additional Example 39 may include the apparatus of Additional Example 36 or some other Additional Example herein, wherein the supported maximum rate can be replaced with 'number of code blocks in the last 'M' OFDM symbols of the data transmission'.

Additional Example 40 may include the apparatus of Additional Example 36 or some other Additional Example herein, wherein the supported maximum rate can be replaced with 'rounded up maximum number of code blocks in any OFDM symbol of the data transmission'.

Additional Example 41 may include the apparatus of Additional Example 36 or some other Additional Example herein, wherein the supported maximum rate can be replaced with 'a combinations of transmit rank, modulation coding scheme ("MCS"), and allocated resource elements ("REs").

Additional Example 42 may include the apparatus of any one or more of Additional Example 35 to Additional Example 20 or some other Additional Example herein, wherein the apparatus is at least one of a user equipment ("UE") or an eNode B.

Additional Example 43 may include a method comprising receiving or causing to receive a signal, processing or causing to process the signal to determine a receiver capability, determining a signal padding based on the receiver capability, and transmitting a response based on the signal comprising the signal padding.

Additional Example 44 may include the method according to Additional Example 43, further comprising applying the signal padding to a subset of orthogonal frequency— division multiplexing ("OFDM") symbols transporting data.

Additional Example 45 may include the method according to Additional Example 43 or Additional Example 44 or some other Additional Example herein, further comprising applying the signal padding by reducing the number of resource elements for data of the subset of the OFDM symbols, wherein a resource element is a single modulated constellation symbol spanning one OFDM symbol and one subcarrier and one spatial layer.

Additional Example 46 may include the method according to Additional Example 43 or Additional Example 44 or some other Additional Example herein, further comprising transmitting the response based on the signal comprising the signal padding by adding non data information bits after encoded information bits.

Additional Example 47 may include the method according to Additional Example 43 or Additional Example 44 or some other Additional Example herein, further comprising transmitting the response based on the signal comprising the signal padding by repeating a subset of encoded information bits.

Additional Example 48 may include the method according to Additional Example 47 and/or some other Additional Example herein, wherein the subset of encoded information bits is from a last N code blocks of the encoded information bits.

Additional Example 49 may include the method according to Additional Example 43 or some other Additional Example herein, further comprising determining the receiver capability based on a signal that informs mapping between required receiver processing time and supported maximum rate for the receiver processing time.

Additional Example 50 may include the method according to Additional Example 43 or some other Additional Example herein, further comprising determining the receiver capability based on a signal that informs mapping between maximum allowed timing advance configured for uplink transmission and supported maximum rate for the maximum allowed timing advance.

Additional Example 51 may include the method of at least one of Additional Example 49 and Additional Example 50 and/or some other Additional Example herein, wherein the supported maximum rate can be replaced with 'average number of code blocks per OFDM symbol of the data transmission'.

Additional Example 52 may include the method of Additional Example 49 and/or some other Additional Example herein, wherein the supported maximum rate can be replaced with 'number of code blocks in the last 'M' OFDM symbols of the data transmission'.

Additional Example 53 may include the method of Additional Example 49 and/or some other Additional Example herein, wherein the supported maximum rate can be replaced with 'rounded up maximum number of code blocks in any OFDM symbol of the data transmission'.

Additional Example 54 may include the method of Additional Example 49 and/or some other Additional Example herein, wherein the supported maximum rate can be replaced with 'a combinations of transmit rank, modulation coding scheme ("MCS"), and allocated resource elements ("REs").

Additional Example 55 may include the method of any one or more of Additional Example 43 to Additional Example 54 or some other Additional Example herein, wherein the method is performed by at least one of a user equipment ("UE") or an eNode B.

Additional Example 56 may include a method comprising determining a receiver capability and transmitting a signal comprising the receiver capability.

Additional Example 57 may include the method of Additional Example 56 or some other Additional Example herein, wherein transmitting the signal comprising the receiver capability comprises informing mapping between required receiver processing time and supported maximum rate for the receiver processing time.

Additional Example 58 may include the method of Additional Example 56 or some other Additional Example herein, wherein transmitting the signal comprising the receiver capability comprises informing mapping between maximum allowed timing advance configured for uplink transmission and supported maximum rate for the maximum allowed timing advance.

Additional Example 59 may include the method of at least one of Additional Example 57 to Additional Example 58 or some other Additional Example herein, wherein the supported maximum rate can be replaced with 'average number of code blocks per orthogonal frequency-division multiplexing ("OFDM") symbol of the data transmission'.

Additional Example 60 may include the method of Additional Example 57 or some other Additional Example herein, wherein the supported maximum rate can be replaced with 'number of code blocks in the last 'M' OFDM symbols of the data transmission'.

Additional Example 61 may include the method of Additional Example 57 or some other Additional Example herein, wherein the supported maximum rate can be replaced with 'rounded up maximum number of code blocks in any OFDM symbol of the data transmission'.

Additional Example 62 may include the method of Additional Example 57 or some other Additional Example herein, wherein the supported maximum rate can be replaced with 'a combinations of transmit rank, modulation coding scheme ("MCS"), and allocated resource elements ("REs").

Additional Example 63 may include the method of any one or more of Additional Example 56 to Additional Example 62 or some other Additional Example herein, wherein the method is performed by at least one of a user equipment ("UE") or an eNode B.

Additional Example 64 may include a system and method of padding for data transmissions based on receiver capability signaling, wherein the padding is applied to a subset of the orthogonal frequency-division multiplexing ("OFDM") symbols transporting data.

Additional Example 65 may include the system and method of Additional Example 64 and/or some other Additional Example herein, wherein the padding is performed by reducing the number of resource elements for data of the subset of the OFDM symbols, wherein a resource element is a single modulated constellation symbol spanning one OFDM symbol and one subcarrier and one spatial layer.

Additional Example 66 may include the system and method of Additional Example 64 and/or some other Additional Example herein, wherein the padding is performed by adding non data information bits after the encoded information bits.

Additional Example 67 may include the system and method of Additional Example 64 and/or some other Additional Example herein, wherein the padding is performed by repeating a subset of encoded information bits.

Additional Example 68 may include the system and method of Additional Example 67 and/or some other Additional Example herein, wherein the subset of encoded information bits is from a last N code blocks of the encoded information bits.

Additional Example 69 may include the system and method of Additional Example 64 and/or some other Additional Example herein, wherein the receiver capability is a signal that informs the mapping between required receiver processing time and supported maximum rate for the said processing time.

Additional Example 70 may include the system and method of Additional Example 64 and/or some other Additional Example herein, wherein the receiver capability is a signal that informs the mapping between maximum allowed timing advance configured for uplink transmission and supported maximum rate for the said timing advance.

Additional Example 71 may include the system and method of Additional Example 69 and Additional Example 70 and/or some other Additional Example herein, wherein the supported maximum rate can be replaced with 'average number of code blocks per OFDM symbol of the data transmission'.

Additional Example 72 may include the system and method of Additional Example 69 and/or some other Additional Example herein, wherein the supported maximum rate can be replaced with 'number of code blocks in the last 'M' OFDM symbols of the data transmission'.

Additional Example 73 may include the system and method of Additional Example 69 and/or some other Additional Example herein, wherein the supported maximum rate can be replaced with 'rounded up maximum number of code blocks in any OFDM symbol of the data transmission'.

Additional Example 74 may include the system and method of Additional Example 69 and/or some other Additional Example herein, wherein the supported maximum rate can be replaced with 'a combinations of transmit rank, modulation coding scheme ("MCS"), and allocated resource elements ("REs")'.

Additional Example 75 may include an apparatus comprising means to perform one or more elements of a method described in or related to any of Additional Example 1 to Additional Example 74, or any other method or process described herein.

Additional Example 76 may include one or more non-transitory computer-readable media comprising instructions to cause an electronic device, upon execution of the instructions by one or more processors of the electronic device, to perform one or more elements of a method described in or related to any of Additional Example 1 to Additional Example 74, or any other method or process described herein.

Additional Example 77 may include an apparatus comprising logic, modules, and/or circuitry to perform one or more elements of a method described in or related to any of Additional Example 1 to Additional Example 74, or any other method or process described herein.

Additional Example 78 may include a method, technique, or process as described in or related to any of Additional Example 1 to Additional Example 74, or portions or parts thereof.

Additional Example 79 may include an apparatus comprising: one or more processors and one or more computer readable media comprising instructions that, when executed by the one or more processors, cause the one or more processors to perform the method, techniques, or process as described in or related to any of Additional Example 1 to Additional Example 74, or portions thereof.

Additional Example 80 may include a method of communicating in a wireless network as shown and described herein.

Additional Example 81 may include a system for providing wireless communication as shown and described herein.

Additional Example 82 may include a device for providing wireless communication as shown and described herein.

In some embodiments, an electronic device may be configured to perform one or more processes, techniques, and/or methods as described herein, or portions thereof. For example, the process may include receiving or causing to receive a signal, processing or causing to process the signal to determine a receiver capability, determining a signal padding based on the receiver capability, applying the signal padding, and transmitting a response based on the signal comprising the signal padding.

In some embodiments, an electronic device may be configured to perform one or more processes, techniques, and/or methods as described herein, or portions thereof. For example, the process may include determine a receiver capability, and transmit a signal comprising receiver capability by at least one of: informing mapping between required receiver processing time and supported maximum rate for the receiver processing time; informing mapping between maximum allowed timing advance configured for uplink transmission and supported maximum rate for the maximum allowed timing advance.

Additional Examples—Set 2

Additional Example 1 may include an apparatus including: means for grouping or causing to group a plurality of code blocks; and means for mapping one or more groups of code block to respective OFDM symbols.

Additional Example 2 may include the apparatus of Additional Example 1 and/or some other Additional Example herein, and may further include: means for segmenting or causing to segment a data transport block into one or more segments; and means for encoding or causing to encode segments of the one or more segments into a code block.

Additional Example 3 may include the apparatus of any of Additional Examples 1 or 2 and/or some other Additional Example herein, and may further include means for computing or causing to compute a cyclic redundancy checksum for each group of code blocks.

Additional Example 4 may include the apparatus of one of Additional Example 3 and/or some other Additional Example herein, and may further include means for appending or causing to append the cyclic redundancy checksum to the group of code blocks.

Additional Example 5 may include the apparatus of any of Additional Examples 1-4 and/or some other Additional Example herein, and wherein means for mapping or causing to map include means for rate matching or causing to rate match a group of code blocks to a plurality of OFDM symbols.

Additional Example 6 may include the apparatus of any of Additional Examples 1-5 and/or some other Additional Example herein, and may further include means for normalizing or causing to normalize the effective code rate of each group of code blocks belonging to a same data transport block.

Additional Example 7 may include the apparatus of Additional Example 6, and wherein means for normalizing or causing to normalize includes means for appending or causing to append a group of code blocks with padding bits or modulated.

Additional Example 8 may include the apparatus of any of Additional Examples 1-8 and/or some other Additional Example herein, wherein information is segmented and wherein the apparatus includes means for determining or causing to determine one or more segment sizes for code blocks based at least in part on one or more of: a determination of available resource elements for each code block group, code rate of a transmission; and/or modulation order of the transmission.

Additional Example 9 may include the apparatus of Additional Example 8 and/or some other Additional Example herein, wherein means for determining or causing to determine a segment size of a code block includes means for determining or causing to determine the segment size according to an approximately linear relationship with the available resource elements for the code block group.

Additional Example 10 may include the apparatus of any of Additional Examples 1-9 and/or some other Additional Example herein, wherein the apparatus is a user equipment (UE), or a portion thereof.

Additional Example 11 may include the apparatus of any of Additional Examples 1-9 and/or some other Additional Example herein, wherein the apparatus is an evolved nodeB (eNB), or a portion thereof.

Additional Example 12 may include a system and method of segmentation of data transport block, encoding each segment into a code block, grouping plurality of code blocks, and mapping group of code block to a plurality of OFDM symbols.

Additional Example 13 may include the system and method of Additional Example 12 and/or some other Additional Example herein, wherein cyclic redundancy checksum is computed for the said group of code blocks and appended to the group of code blocks.

Additional Example 14 may include the system and method of Additional Example 12 and/or some other Additional Example herein, wherein a group of code blocks is rate matched to a plurality of OFDM symbols.

Additional Example 15 may include the system and method of Additional Example 12 and/or some other Additional Example herein, wherein a group of code blocks is appended with padding bits or modulated symbols to normalize the effective code rate of each group of code blocks belonging to the same data transport block to be similar.

Additional Example 16 may include the system and method of Additional Example 12 and/or some other Additional Example herein, wherein information is segmented and each segment size is determined by available resource elements for each code block group and code rate and modulation order of the transmission.

Additional Example 17 may include the system and method of Additional Example 16 and/or some other Additional Example herein, wherein the segment size of a code block and the available resource elements for the said code block have approximately linear relationship.

Additional Example 18 may include a method including: grouping or causing to group a plurality of code blocks; and mapping one or more groups of code block to respective OFDM symbols.

Additional Example 19 may include the method of Additional Example 18 and/or some other Additional Example herein, and may further include: segmenting or causing to segment a data transport block into one or more segments; and encoding or causing to encode segments of the one or more segments into a code block;

Additional Example 20 may include the method of any of Additional Examples 18 or 19 and/or some other Additional Example herein, and further including computing or causing to compute a cyclic redundancy checksum for each code block of the group of code blocks.

Additional Example 21 may include the method of one of Additional Example 20 and/or some other Additional Example herein, and further including appending or causing to append the cyclic redundancy checksum to the group of code blocks.

Additional Example 22 may include the method of any of Additional Examples 18-21 and/or some other Additional Example herein, and wherein mapping or causing to map includes rate matching or causing to rate match a group of code blocks to a plurality of OFDM symbols.

Additional Example 23 may include the method of any of Additional Examples 18-22 and/or some other Additional Example herein, and further including normalizing or causing to normalize the effective code rate of each group of code blocks belonging to a same data transport block.

Additional Example 24 may include the method of Additional Example 23, and wherein normalizing or causing to normalize includes appending or causing to append a group of code blocks with padding bits or modulated.

Additional Example 25 may include the method of any of Additional Examples 18-24 and/or some other Additional Example herein, wherein information is segmented and wherein the method includes determining or causing to determine one or more segment sizes for code blocks based at least in part on one or more of: a determination of available resource elements for each code block group, code rate of a transmission; and/or modulation order of the transmission.

Additional Example 26 may include the method of Additional Example 25 and/or some other Additional Example herein, wherein determining or causing to determine a segment size of a code block includes determining or causing to determine the segment size according to an approximately linear relationship with the available resource elements for the code block group.

Additional Example 27 may include the method of any of Additional Examples 18-26 and/or some other Additional Example herein, wherein the method is performed by a user equipment (UE), or a portion thereof.

Additional Example 28 may include the method of any of Additional Examples 18-26 and/or some other Additional Example herein, wherein the method is performed by an evolved nodeB (eNB), or a portion thereof.

Additional Example 29 may include an apparatus including circuitry to: identify a plurality of collections of code blocks; and generate an association between collections of the plurality of collections of code blocks to respective OFDM symbols.

Additional Example 30 may include the apparatus of Additional Example 29 and/or some other Additional Example herein, and may further include circuitry to: segment a data transport block into one or more segments; and encode segments of the one or more segments into a code block;

Additional Example 31 may include the apparatus of any of Additional Examples 29 or 30 and/or some other Additional Example herein, and may further include circuitry to compute a cyclic redundancy checksum for a collection of code blocks.

Additional Example 32 may include the apparatus of one of Additional Example 31 and/or some other Additional Example herein, and may further include circuitry to appending or causing to append the cyclic redundancy checksum to the collection of code blocks.

Additional Example 33 may include the apparatus of any of Additional Examples 29-32 and/or some other Additional Example herein, and wherein circuitry to map includes circuitry to rate match a collection of code blocks to a plurality of OFDM symbols.

Additional Example 34 may include the apparatus of any of Additional Examples 29-33 and/or some other Additional Example herein, and may further include circuitry to normalize the effective code rate of each collection of code blocks belonging to a same data transport block.

Additional Example 35 may include the apparatus of Additional Example 34, and wherein circuitry to normalize includes circuitry to append a group of code blocks with padding bits or modulated.

Additional Example 36 may include the apparatus of any of Additional Examples 29-35 and/or some other Additional Example herein, wherein information is segmented and wherein the apparatus includes circuitry to determine one or more segment sizes for code blocks based at least in part on one or more of: a determination of available resource elements for each code block group, code rate of a transmission; and/or modulation order of the transmission.

Additional Example 37 may include the apparatus of Additional Example 36 and/or some other Additional Example herein, wherein circuitry to determine a segment size of a code block includes circuitry to determine the segment size according to an approximately linear relationship with the available resource elements for the code block group.

Additional Example 38 may include the apparatus of any of Additional Examples 29-37 and/or some other Additional Example herein, wherein the apparatus is a user equipment (UE), or a portion thereof.

Additional Example 39 may include the apparatus of any of Additional Examples 29-37 and/or some other Additional Example herein, wherein the apparatus is an evolved nodeB (eNB), or a portion thereof.

Additional Example 40 may include an apparatus comprising means to perform one or more elements of a method described in or related to any of Additional Examples 1-39, or any other method or process described herein.

Additional Example 41 may include one or more non-transitory computer-readable media comprising instructions to cause an electronic device, upon execution of the instructions by one or more processors of the electronic device, to perform one or more elements of a method described in or related to any of Additional Examples 1-39, or any other method or process described herein.

Additional Example 42 may include an apparatus comprising logic, modules, and/or circuitry to perform one or more elements of a method described in or related to any of Additional Examples 1-39, or any other method or process described herein.

Additional Example 43 may include a method, technique, or process as described in or related to any of Additional Examples 1-39, or portions or parts thereof.

Additional Example 44 may include an apparatus comprising: one or more processors and one or more computer readable media comprising instructions that, when executed by the one or more processors, cause the one or more processors to perform the method, techniques, or process as described in or related to any of Additional Examples 1-39, or portions thereof.

Additional Example 45 may include a method of communicating in a wireless network as shown and described herein.

Additional Example 46 may include a system for providing wireless communication as shown and described herein.

Additional Example 47 may include a device for providing wireless communication as shown and described herein.

In some embodiments, an electronic device may be configured to perform one or more processes, techniques, and/or methods as described herein, or portions thereof. For example, the process may include grouping or causing to group a plurality of code blocks and mapping one or more groups of code block to respective OFDM symbols.

Embodiments and implementations of the systems and methods described herein may include various operations, which may be embodied in machine-executable instructions to be executed by a computer system. A computer system may include one or more general-purpose or special-purpose computers (or other electronic devices). The computer system may include hardware components that include specific logic for performing the operations or may include a combination of hardware, software, and/or firmware.

Computer systems and the computers in a computer system may be connected via a network. Suitable networks for configuration and/or use as described herein include one or more local area networks, wide area networks, metropolitan area networks, and/or Internet or IP networks, such as the World Wide Web, a private Internet, a secure Internet, a value-added network, a virtual private network, an extranet, an intranet, or even stand-alone machines which communicate with other machines by physical transport of media. In particular, a suitable network may be formed from parts or entireties of two or more other networks, including networks using disparate hardware and network communication technologies.

One suitable network includes a server and one or more clients; other suitable networks may contain other combinations of servers, clients, and/or peer-to-peer nodes, and a given computer system may function both as a client and as a server. Each network includes at least two computers or computer systems, such as the server and/or clients. A computer system may include a workstation, laptop computer, disconnectable mobile computer, server, mainframe, cluster, so-called "network computer" or "thin client," tablet, smart phone, personal digital assistant or other hand-held computing device, "smart" consumer electronics device or appliance, medical device, or a combination thereof.

Suitable networks may include communications or networking software, such as the software available from Novell®, Microsoft®, and other vendors, and may operate using TCP/IP, SPX, IPX, and other protocols over twisted pair, coaxial, or optical fiber cables, telephone lines, radio waves, satellites, microwave relays, modulated AC power lines, physical media transfer, and/or other data transmission "wires" known to those of skill in the art. The network may encompass smaller networks and/or be connectable to other networks through a gateway or similar mechanism.

Various techniques, or certain aspects or portions thereof, may take the form of program code (i.e., instructions) embodied in tangible media, such as floppy diskettes, CD-ROMs, hard drives, magnetic or optical cards, solid-state memory devices, a nontransitory computer-readable storage medium, or any other machine-readable storage medium wherein, when the program code is loaded into and executed by a machine, such as a computer, the machine becomes an apparatus for practicing the various techniques. In the case of program code execution on programmable computers, the computing device may include a processor, a storage medium readable by the processor (including volatile and nonvolatile memory and/or storage elements), at least one input device, and at least one output device. The volatile and nonvolatile memory and/or storage elements may be a RAM, an EPROM, a flash drive, an optical drive, a magnetic hard drive, or other medium for storing electronic data. The eNB (or other base station) and UE (or other mobile station) may also include a transceiver component, a counter component, a processing component, and/or a clock component or timer component. One or more programs that may implement or utilize the various techniques described herein may use an application programming interface (API), reusable controls, and the like. Such programs may be implemented in a high-level procedural or an object-oriented programming language to communicate with a computer system. However, the program(s) may be implemented in assembly or machine language, if desired. In any case, the language may be a compiled or interpreted language, and combined with hardware implementations.

Each computer system includes one or more processors and/or memory; computer systems may also include various input devices and/or output devices. The processor may include a general purpose device, such as an Intel®, AMD®, or other "off-the-shelf" microprocessor. The processor may include a special purpose processing device, such as ASIC, SoC, SiP, FPGA, PAL, PLA, FPLA, PLD, or other customized or programmable device. The memory may include static RAM, dynamic RAM, flash memory, one or more flip-flops, ROM, CD-ROM, DVD, disk, tape, or magnetic, optical, or other computer storage medium. The input device(s) may include a keyboard, mouse, touch screen, light pen, tablet, microphone, sensor, or other hardware with accompanying firmware and/or software. The output device(s) may include a monitor or other display, printer, speech or text synthesizer, switch, signal line, or other hardware with accompanying firmware and/or software.

It should be understood that many of the functional units described in this specification may be implemented as one or more components, which is a term used to more particularly emphasize their implementation independence. For example, a component may be implemented as a hardware circuit comprising custom very large scale integration (VLSI) circuits or gate arrays, or off-the-shelf semiconductors such as logic chips, transistors, or other discrete components. A component may also be implemented in programmable hardware devices such as field programmable gate arrays, programmable array logic, programmable logic devices, or the like.

Components may also be implemented in software for execution by various types of processors. An identified component of executable code may, for instance, comprise one or more physical or logical blocks of computer instructions, which may, for instance, be organized as an object, a procedure, or a function. Nevertheless, the executables of an identified component need not be physically located together, but may comprise disparate instructions stored in different locations that, when joined logically together, comprise the component and achieve the stated purpose for the component.

Indeed, a component of executable code may be a single instruction, or many instructions, and may even be distributed over several different code segments, among different programs, and across several memory devices. Similarly, operational data may be identified and illustrated herein within components, and may be embodied in any suitable form and organized within any suitable type of data structure. The operational data may be collected as a single data set, or may be distributed over different locations including over different storage devices, and may exist, at least partially, merely as electronic signals on a system or network. The components may be passive or active, including agents operable to perform desired functions.

Several aspects of the embodiments described will be illustrated as software modules or components. As used herein, a software module or component may include any type of computer instruction or computer-executable code located within a memory device. A software module may, for instance, include one or more physical or logical blocks of computer instructions, which may be organized as a routine, program, object, component, data structure, etc., that perform one or more tasks or implement particular data types. It is appreciated that a software module may be implemented in hardware and/or firmware instead of or in addition to software. One or more of the functional modules described herein may be separated into sub-modules and/or combined into a single or smaller number of modules.

In certain embodiments, a particular software module may include disparate instructions stored in different locations of a memory device, different memory devices, or different computers, which together implement the described functionality of the module. Indeed, a module may include a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules may be located in local and/or remote memory storage devices. In addition, data being tied or rendered together in a database record may be resident in the same memory device, or across several memory devices, and may be linked together in fields of a record in a database across a network.

Reference throughout this specification to "an example" means that a particular feature, structure, or characteristic described in connection with the example is included in at least one embodiment. Thus, appearances of the phrase "in an example" in various places throughout this specification are not necessarily all referring to the same embodiment.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on its presentation in a common group without indications to the contrary. In addition, various embodiments and examples may be referred to herein along with alternatives for the various components thereof. It is understood that such embodiments, examples, and alternatives are not to be construed as de facto equivalents of one another, but are to be considered as separate and autonomous representations.

Furthermore, the described features, structures, or characteristics may be combined in any suitable manner in one or more embodiments. In the following description, numerous specific details are provided, such as examples of materials, frequencies, sizes, lengths, widths, shapes, etc., to provide a thorough understanding of the embodiments. One skilled in the relevant art will recognize, however, that the embodiments may be practiced without one or more of the specific details, or with other methods, components, materials, etc. In other instances, well-known structures, materials, or operations are not shown or described in detail to avoid obscuring aspects of embodiments.

It should be recognized that the systems described herein include descriptions of specific embodiments. These embodiments can be combined into single systems, partially combined into other systems, split into multiple systems or divided or combined in other ways. In addition, it is contemplated that parameters/attributes/aspects/etc. of one embodiment can be used in another embodiment. The parameters/attributes/aspects/etc. are merely described in one or more embodiments for clarity, and it is recognized that the parameters/attributes/aspects/etc. can be combined with or substituted for parameters/attributes/etc. of another embodiment unless specifically disclaimed herein.

Although the foregoing has been described in some detail for purposes of clarity, it will be apparent that certain changes and modifications may be made without departing from the principles thereof. It should be noted that there are many alternative ways of implementing both the processes and apparatuses described herein. Accordingly, the present embodiments are to be considered illustrative and not restrictive, and the description is not to be limited to the details given herein, but may be modified within the scope and equivalents of the appended claims.

Those having skill in the art will appreciate that many changes may be made to the details of the above-described embodiments without departing from the underlying principles. The scope of the present embodiments should, therefore, be determined only by the following claims.

The invention claimed is:

1. A radio access network (RAN) node, comprising:
a transmitter interface configured to provide a set of orthogonal frequency-division multiplex (OFDM) symbols to a transmitter for transmission to a user equipment (UE); and
a processor configured to:
segment a bit sequence into blocks;
encode the blocks to form code blocks;
group the code blocks into a code block group, the code block group selected to fit an integer number of code blocks within an OFDM symbol group, the OFDM symbol group including an integer number of OFDM symbols;
encode the code block group to form the OFDM symbol group; and
provide the OFDM symbol group to the transmitter using the transmitter interface.

2. The RAN node of claim 1, wherein the processor is further configured to receive the bit sequence from an application.

3. The RAN node of claim 1, wherein the processor is further configured to compute a cyclic redundancy checksum (CRC) for the code block group and append the CRC to the code block group for encoding to form the OFDM symbol group.

4. The RAN node of claim 1, wherein the processor is further configured to segment data that includes the bit sequence, a segment size based at least in part on available resource elements for a set of code block groups, code rate and modulation order of a transmission including the OFDM symbol group.

5. The RAN node of claim 4, wherein the segment size of a code block and the available resource elements for the code block have an approximately linear relationship.

6. The RAN node of claim 1, wherein the processor is further configured to append padding bits or modulated symbols to normalize an effective code rate of the code block group with other code block groups within a transport block.

7. The RAN node of claim 1, wherein the processor is a baseband processor.

8. A user equipment (UE), comprising:
a receiver interface configured to provide a set of orthogonal frequency-division multiplex (OFDM) symbols from a receiver from a radio access network (RAN) node; and
a processor configured to:
receive an OFDM symbol group from the receiver interface;
decode a set of code blocks forming a code block group, the code block group selected to fit an integer number of code blocks within the OFDM symbol group, the OFDM symbol group including an integer number of OFDM symbols, wherein an OFDM symbol group boundary matches a code block group boundary; and
provide a response to the RAN node acknowledging a receipt of data from the OFDM symbol group.

9. The UE of claim 8, wherein the processor is further configured to receive the bit sequence from an application.

10. The UE of claim 8, wherein the processor is further configured to compute a first cyclic redundancy checksum (CRC) for the code block group and compare the first CRC to a second CRC appended to the code block group.

11. The UE of claim 10, wherein the response is an acknowledgement based at least in part on the first CRC matching the second CRC.

12. The UE of claim 8, wherein the processor is a baseband processor.

13. A method for a user equipment (UE), the method comprising:
- receiving an orthogonal frequency-division multiplex (OFDM) symbol group from a radio access network (RAN) node;
- decoding a set of code blocks forming a code block group, the code block group selected to fit an integer number of code blocks within the OFDM symbol group, the OFDM symbol group including an integer number of OFDM symbols, wherein an OFDM symbol group boundary matches a code block group boundary; and
- providing a response to the RAN node acknowledging a receipt of data from the OFDM symbol group.

14. The apparatus of claim 13, further comprising receiving the bit sequence from an application.

15. The apparatus of claim 13, further comprising computing a first cyclic redundancy checksum (CRC) for the code block group and comparing the first CRC to a second CRC appended to the code block group.

16. The apparatus of claim 15, wherein the response comprises an acknowledgement based at least in part on the first CRC matching the second CRC.

* * * * *